United States Patent
Kato et al.

(10) Patent No.: US 9,673,420 B2
(45) Date of Patent: Jun. 6, 2017

(54) ORGANIC ELECTROLUMINESCENT DEVICE, ILLUMINATION APPARATUS, AND ILLUMINATION SYSTEM

(71) Applicant: Kabushiki Kaisha Toshiba, Tokyo (JP)

(72) Inventors: Daimotsu Kato, Tokyo (JP); Tomio Ono, Yokohama (JP); Shintaro Enomoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 14/813,622

(22) Filed: Jul. 30, 2015

(65) Prior Publication Data

US 2015/0340657 A1   Nov. 26, 2015

Related U.S. Application Data

(63) Continuation of application No. PCT/JP2013/078736, filed on Oct. 23, 2013.

(30) Foreign Application Priority Data

Feb. 8, 2013   (JP) .................................. 2013-023887

(51) Int. Cl.
*H01L 51/00* (2006.01)
*H01L 51/52* (2006.01)
(Continued)

(52) U.S. Cl.
CPC .......... *H01L 51/5262* (2013.01); *H01L 51/52* (2013.01); *H01L 51/5209* (2013.01);
(Continued)

(58) Field of Classification Search
CPC . H01L 51/5262; H01L 51/52; H01L 51/5209; H01L 51/5225; H05B 33/0896; H05B 33/28
See application file for complete search history.

(56) References Cited

U.S. PATENT DOCUMENTS 8,841,656 B2   9/2014   Sugizaki et al.
8,853,936 B2   10/2014  Sugizaki et al.
(Continued)

FOREIGN PATENT DOCUMENTS

JP   2001-345185   12/2001
JP   4023141      12/2007
(Continued)

OTHER PUBLICATIONS

International Search Report issued Dec. 24, 2013 in PCT/JP2013/078736 filed Oct. 23, 2013.

(Continued)

*Primary Examiner* — Anne Hines

(74) *Attorney, Agent, or Firm* — Oblon, McClelland, Maier & Neustadt, L.L.P.

(57) ABSTRACT

An organic electroluminescent device includes a first electrode, an insulating layer, an organic light emitting layer, a second electrode, and a light transmissive part. The first electrode has an upper face. The insulating layer is provided on the upper face. The insulating layer includes first to fifth insulating parts. The organic light emitting layer is provided on the upper face in between the insulating parts. The second electrode is provided on the organic light emitting layer. The light transmissive part overlaps the first region of the first electrode when projected onto the plane. The light transmissive part makes a phase of a first light permeating the first region to be different from a phase of a second light permeating the second region of the first electrode.

19 Claims, 11 Drawing Sheets

(51) Int. Cl.
*H05B 33/08* (2006.01)
*H05B 33/28* (2006.01)
*H01L 27/32* (2006.01)

(52) U.S. Cl.
CPC ..... *H01L 51/5225* (2013.01); *H05B 33/0896* (2013.01); *H05B 33/28* (2013.01); *H01L 27/3204* (2013.01); *H01L 27/3232* (2013.01); *H01L 51/5212* (2013.01); *H01L 51/5228* (2013.01); *H01L 51/5246* (2013.01); *H01L 2251/5323* (2013.01); *H01L 2251/5361* (2013.01)

(56) References Cited

U.S. PATENT DOCUMENTS

| | | | |
|---|---|---|---|
| 8,902,383 | B2 | 12/2014 | Sugi et al. |
| 8,963,414 | B2 | 2/2015 | Sawabe et al. |
| 2001/0024083 | A1 | 9/2001 | Yamazaki et al. |
| 2005/0024339 | A1* | 2/2005 | Yamazaki ............ G06F 1/1616 345/169 |
| 2010/0052524 | A1 | 3/2010 | Kinoshita |
| 2011/0215711 | A1 | 9/2011 | Yonehara et al. |
| 2012/0299002 | A1 | 11/2012 | Kinoshita |
| 2014/0140047 | A1 | 5/2014 | Sawabe et al. |
| 2015/0333287 | A1 | 11/2015 | Sawabe et al. |
| 2015/0333288 | A1 | 11/2015 | Sugi et al. |
| 2015/0340642 | A1 | 11/2015 | Shinjo et al. |
| 2015/0340643 | A1 | 11/2015 | Kato et al. |
| 2015/0340650 | A1 | 11/2015 | Kakizoe et al. |
| 2015/0340660 | A1 | 11/2015 | Wada et al. |

FOREIGN PATENT DOCUMENTS

| | | |
|---|---|---|
| JP | 2010-056017 | 3/2010 |
| JP | 2011-181403 | 9/2011 |
| JP | 2011-249541 | 12/2011 |
| JP | 2012-084371 | 4/2012 |
| JP | 2012-099319 | 5/2012 |
| WO | WO 2004/077386 | 9/2004 |

OTHER PUBLICATIONS

International Preliminary Report on Patentability and Written Opinion issued Aug. 20, 2015 in PCT/JP2013/078736 (with English language translation).

* cited by examiner

ORGANIC ELECTROLUMINESCENT DEVICE, ILLUMINATION APPARATUS, AND ILLUMINATION SYSTEM

CROSS-REFERENCE TO RELATED APPLICATIONS

This is a continuation application of International Application PCT/JP2013/078736, filed on Oct. 23, 2013; the entire contents of which are incorporated herein by reference.

FIELD

Embodiments described herein relate generally to an organic electroluminescent device, an illumination apparatus, and an illumination system.

BACKGROUND

There is an organic electroluminescent device that includes a light transmissive first electrode, a second electrode, and an organic light emitting layer provided between the first electrode and the second electrode. There is an illumination apparatus using the organic electroluminescent device as a light source. There is an illumination system that includes a plurality of organic electroluminescent devices and a controller configured to control turning on and off of the plurality of organic electroluminescent devices. The organic electroluminescent device is made to be light transmissive by using a thin-line shaped second electrode in which a plurality of openings are provided, or using a light transmissive second electrode. An improvement in the visibility of a transmission image is desired in such an organic electroluminescent device.

DETAILED DESCRIPTION

Figure 1A:
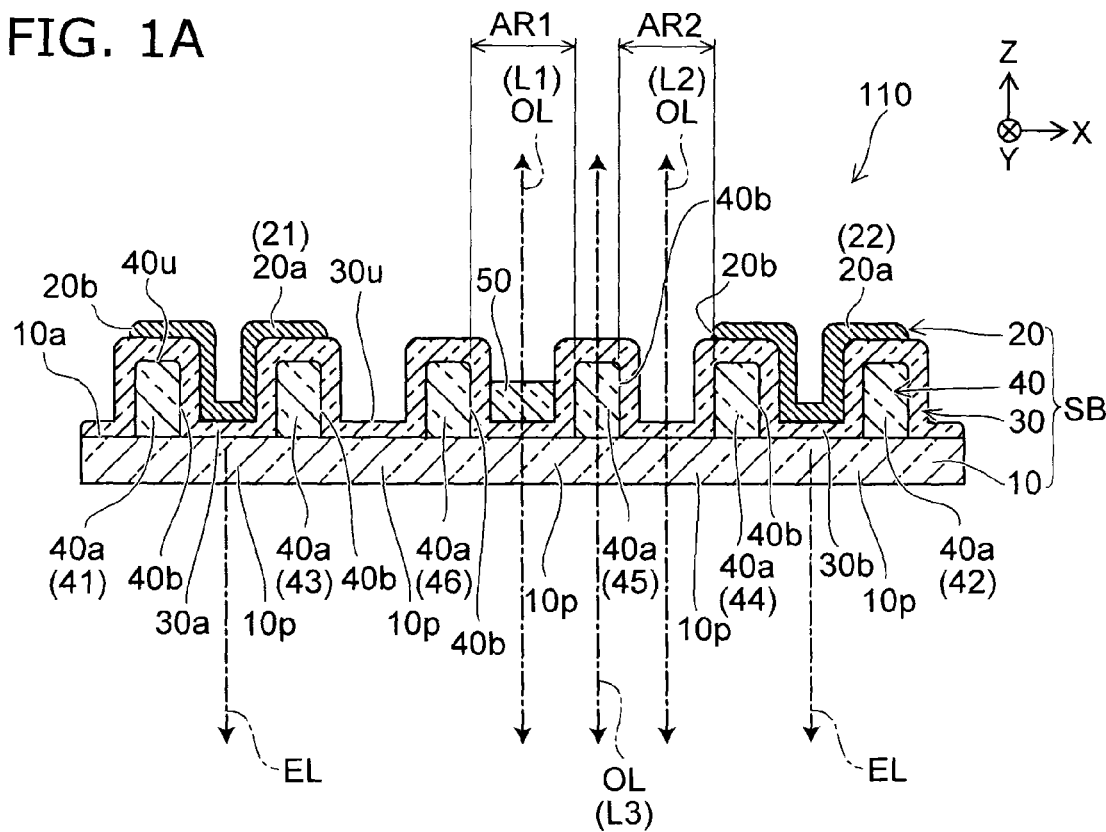
FIGS. 1A and 1B are schematic views showing an organic electroluminescent device according to a first embodiment.

According to one embodiment, an organic electroluminescent device includes a first electrode, an insulating layer, an organic light emitting layer, a second electrode, and a light transmissive part. The first electrode has an upper face. The first electrode is light transmissive. The insulating layer is provided on the upper face. The insulating layer is light transmissive. The insulating layer includes a first insulating part, a second insulating part, a third insulating part, a fourth insulating part, and a fifth insulating part. The second insulating part is separated from the first insulating part in a first direction parallel to the upper face. The third insulating part is provided between the first insulating part and the second insulating part. The fourth insulating part is provided between the second insulating part and the third insulating part. The fifth insulating part is provided between the third insulating part and the fourth insulating part. The first electrode includes a first region and a second region. The first region is located between the third insulating part and the fifth insulating part when projected onto a plane parallel to the upper face. The second region is located between the fourth insulating part and the fifth insulating part when projected onto the plane. The organic light emitting layer includes a first portion and a second portion. The first portion is provided on the upper face in between the first insulating part and the third insulating part. The second portion is provided on the upper face in between the second insulating part and the fourth insulating part. The second electrode includes a first conductive part and a second conductive part. The first conductive part is provided on the first portion. The second conductive part is provided on the second portion. The second electrode is light reflective. The light transmissive part overlaps the first region when projected onto the plane. The light transmissive part makes a phase of a first light permeating the first region to be different from a phase of a second light permeating the second region.

According to another embodiment, an organic electroluminescent device includes a first electrode, an insulating layer, an organic light emitting layer, a second electrode, and a light transmissive part. The first electrode has an upper face. The first electrode is light transmissive. The insulating layer is provided on the upper face. The insulating layer is light transmissive. The insulating layer includes a first insulating part, a second insulating part, and a third insulating part. The second insulating part is separated from the first insulating part in a first direction parallel to the upper face. The third insulating part is provided between the first insulating part and the second insulating part. The first electrode includes a first region and a second region. The first region is located between the first insulating part and the third insulating part when projected onto a plane parallel to the upper face. The second region is located between the second insulating part and the third insulating part when projected onto the plane. The organic light emitting layer is provided on the insulating layer. The organic light emitting layer includes a first portion and a second portion. The first portion is provided on the upper face in between the first insulating part and the third insulating part. The second portion is provided on the upper face in between the second insulating part and the third insulating part. The organic light emitting layer includes a portion provided on the first insulating part, a portion provided on the second insulating part, and a portion provided on the third insulating part. The organic light emitting layer extends on the upper face in the first portion and the second portion, and extends on each of the first insulating part, the second insulating part, and the third insulating part. The second electrode is provided on the organic light emitting layer. The second electrode is light transmissive. The light transmissive part overlaps the first region when projected onto the plane. A phase of a first light permeating the first region is different from a phase of a second light permeating the second region.

According to another embodiment, an illumination apparatus includes an organic electroluminescent device and a power source. The organic electroluminescent device includes a first electrode, an insulating layer, an organic light emitting layer, a second electrode, and a light transmissive part. The first electrode has an upper face. The first electrode is light transmissive. The insulating layer is provided on the upper face. The insulating layer is light transmissive. The insulating layer includes a first insulating part, a second insulating part, a third insulating part, a fourth insulating part, and a fifth insulating part. The second insulating part is separated from the first insulating part in a first direction parallel to the upper face. The third insulating part is provided between the first insulating part and the second insulating part. The fourth insulating part is provided between the second insulating part and the third insulating part. The fifth insulating part is provided between the third insulating part and the fourth insulating part. The first electrode includes a first region and a second region. The first region is located between the third insulating part and the fifth insulating part when projected onto a plane parallel to the upper face. The second region is located between the fourth insulating part and the fifth insulating part when projected onto the plane. The organic light emitting layer includes a first portion and a second portion. The first portion is provided on the upper face in between the first insulating part and the third insulating part. The second portion is provided on the upper face in between the second insulating part and the fourth insulating part. The second electrode includes a first conductive part and a second conductive part. The first conductive part is provided on the first portion. The second conductive part is provided on the second portion. The second electrode is light reflective. The light transmissive part overlaps the first region when projected onto the plane. The light transmissive part makes a phase of a first light permeating the first region to be different from a phase of a second light permeating the second region. The power source is electrically connected to the first electrode and the second electrode and supplies a current to the organic light emitting layer via the first electrode and the second electrode.

According to another embodiment, an illumination apparatus includes an organic electroluminescent device and a power source. The organic electroluminescent device includes a first electrode, an insulating layer, an organic light emitting layer, a second electrode, and a light transmissive part. The first electrode has an upper face. The first electrode is light transmissive. The insulating layer is provided on the upper face. The insulating layer is light transmissive. The insulating layer includes a first insulating part, a second insulating part, and a third insulating part. The second insulating part is separated from the first insulating part in a first direction parallel to the upper face. The third insulating part is provided between the first insulating part and the second insulating part. The first electrode includes a first region and a second region. The first region is located between the first insulating part and the third insulating part when projected onto a plane parallel to the upper face. The second region is located between the second insulating part and the third insulating part when projected onto the plane. The organic light emitting layer is provided on the insulating layer. The organic light emitting layer includes a first portion and a second portion. The first portion is provided on the upper face in between the first insulating part and the third insulating part. The second portion is provided on the upper face in between the second insulating part and the third insulating part. The second electrode is provided on the organic light emitting layer. The second electrode is light transmissive. The light transmissive part overlaps the first region when projected onto the plane. The power source is electrically connected to the first electrode and the second electrode and supplies a current to the organic light emitting layer via the first electrode and the second electrode. A phase of a first light permeating the first region is different from a phase of a second light permeating the second region.

According to another embodiment, an illumination system includes a plurality of organic electroluminescent devices and a controller. Each of the organic electroluminescent devices includes a first electrode, an insulating layer, an organic light emitting layer, a second electrode, and a light transmissive part. The first electrode has an upper face. The first electrode is light transmissive. The insulating layer is provided on the upper face. The insulating layer is light transmissive. The insulating layer includes a first insulating part, a second insulating part, a third insulating part, a fourth insulating part, and a fifth insulating part. The second insulating part is separated from the first insulating part in a first direction parallel to the upper face. The third insulating part is provided between the first insulating part and the second insulating part. The fourth insulating part is provided between the second insulating part and the third insulating part. The fifth insulating part is provided between the third insulating part and the fourth insulating part. The first electrode includes a first region and a second region. The first region is located between the third insulating part and the fifth insulating part when projected onto a plane parallel to the upper face. The second region is located between the fourth insulating part and the fifth insulating part when projected onto the plane. The organic light emitting layer includes a first portion and a second portion. The first portion is provided on the upper face in between the first insulating part and the third insulating part. The second portion is provided on the upper face in between the second insulating part and the fourth insulating part. The second electrode includes a first conductive part and a second conductive part. The first conductive part is provided on the first portion. The second conductive part is provided on the second portion. The second electrode is light reflective. The light transmissive part overlaps the first region when projected onto the plane. The light transmissive part makes a phase of a first light permeating the first region to be different from a phase of a second light permeating the second region. The controller is electrically connected to each of the organic electroluminescent devices and controls turning on and off of each of the organic electroluminescent devices.

According to another embodiment, an illumination system includes a plurality of organic electroluminescent devices and a controller. Each of the organic electroluminescent devices includes a first electrode, an insulating layer, an organic light emitting layer, a second electrode, and a light transmissive part. The first electrode has an upper face. The first electrode is light transmissive. The insulating layer is provided on the upper face. The insulating layer is light transmissive. The insulating layer includes a first insulating part, a second insulating part, and a third insulating part. The second insulating part is separated from the first insulating part in a first direction parallel to the upper face. The third insulating part is provided between the first insulating part and the second insulating part. The first electrode includes a first region and a second region. The first region is located between the first insulating part and the third insulating part when projected onto a plane parallel to the upper face. The second region is located between the second insulating part and the third insulating part when projected onto the plane. The organic light emitting layer is provided on the insulating layer. The organic light emitting layer includes a first portion and a second portion. The first portion is provided on the upper face in between the first insulating part and the third insulating part. The second portion is provided on the upper face in between the second insulating part and the third insulating part. The organic light emitting layer includes a portion provided on the first insulating part, a portion provided on the second insulating part, and a portion provided on the third insulating part. The organic light emitting layer extends on the upper face in the first portion and the second portion, and extends on each of the first insulating part, the second insulating part, and the third insulating part. The second electrode is provided on the organic light emitting layer. The second electrode is light transmissive. The light transmissive part overlaps the first region when projected onto the plane. The controller is electrically connected to each of the organic electroluminescent devices and controls turning on and off of each of the organic electroluminescent devices. A phase of a first light permeating the first region is different from a phase of a second light permeating the second region.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Also, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
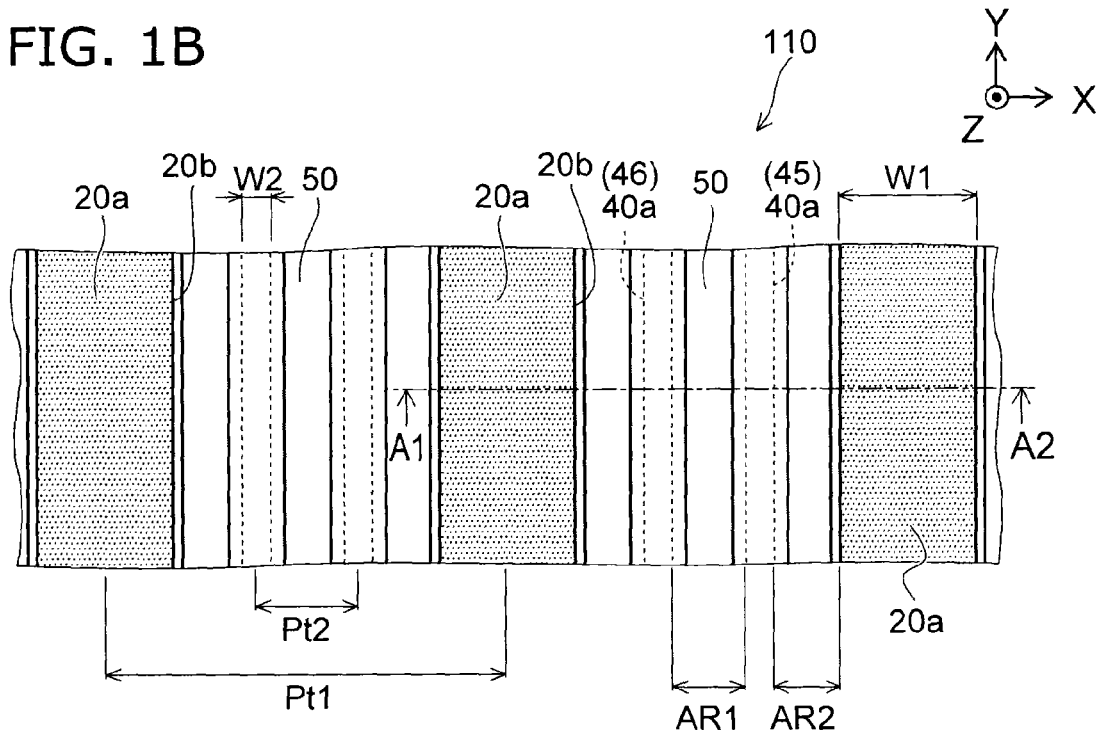

FIGS. 1A and 1B are schematic views showing an organic electroluminescent device according to a first embodiment.

FIG. 1A is a schematic cross-sectional view and FIG. 1B is a schematic plan view.

FIG. 1A is a cross-sectional view along an A1-A2 line in FIG. 1B. These drawings expand and illustrate a part of an organic electroluminescent device according to the embodiment.

As shown in FIGS. 1A and 1B, an organic electroluminescent device 110 includes a stacked body SB. The stacked body SB includes a first electrode 10, a second electrode 20, an organic light emitting layer 30, and an insulating layer 40. In the example, the stacked body SB further includes a light transmissive part 50.

The first electrode 10 has an upper face 10a. The first electrode 10 has light permeability. The first electrode 10 is, for example, a transparent electrode.

Here, the direction perpendicular to the upper face 10a is defined as a Z-axis direction. One direction parallel to the upper face 10a is defined as an X-axis direction. The direction perpendicular to the X-axis direction and the Z-axis direction is defined as a Y-axis direction. The X-axis direction and the Y-axis direction are the directions perpendicular to the Z-axis direction. The Z-axis direction corresponds to the thickness direction of the first electrode 10.

The insulating layer 40 is provided on the upper face 10a of the first electrode 10. The insulating layer 40 has an insulating part 40a and an opening 40b. The insulating layer 40 has, for example, a plurality of insulating parts 40a and a plurality of openings 40b. Each of the plurality of insulating parts 40a is arranged side by side in a first direction parallel to the upper face 10a. Each of the plurality of insulating parts 40a extends in a second direction parallel to the upper face 10a and perpendicular to the first direction. In the example, each of the plurality of insulating parts 40a is arranged side by side in the X-axis direction and extends in the Y-axis direction. Each of the plurality of openings 40b is provided between each of the plurality of insulating parts 40a. In the example, each of the plurality of openings 40b extends in the Y-axis direction and is arranged side by side in the X-axis direction. That is, in the example, each of the plurality of openings 40b is in a trench shape. Each of the plurality of openings 40b allows a part of the first electrode 10 to be exposed. In the example, by each of the plurality of openings 40b, a plurality of portions of the first electrode 10 are exposed. Hereinafter, the portion exposed by the opening 40b of the first electrode 10 will be referred to as an exposed part 10p.

The organic light emitting layer 30 is provided on the insulating layer 40. In the example, the organic light emitting layer 30 is provided on the whole of the insulating layer 40. In the example, the organic light emitting layer 30 includes portions extending on each of the plurality of exposed parts 10p of the first electrode 10 and portions extending on each of the plurality of insulating parts 40a of the insulating layer 40. The organic light emitting layer 30 has light permeability.

The thickness of the organic light emitting layer 30 (the length along the Z-axis direction) is thinner than the thickness of the insulating layer 40 (the insulating part 40a). The distance in the Z-axis direction between an upper face 30u of the portion extending over the exposed part 10p of the organic light emitting layer 30 and the upper face 10a of the first electrode 10 is shorter than the distance in the Z-axis direction between an upper face 40u of the insulating part 40a of the insulating layer 40 and the upper face 10a of the first electrode 10. That is, the upper face 30u is positioned below the upper face 40u.

The second electrode 20 is provided on the organic light emitting layer 30. The second electrode 20 has a plurality of conductive parts 20a and a plurality of openings 20b. The conductive part 20a is disposed over at least a part of the first portion 30a. In the example, the second electrode 20 has a plurality of conductive parts 20a. Each of the plurality of conductive parts 20a extends in the Y-axis direction and is arranged side by side in the X-axis direction. Each of the plurality of conductive parts 20a is disposed in a position that overlaps with the exposed part 10p, when being projected onto a plane parallel to the upper face 10a (an X-Y plane). The space between each of the plurality of conductive parts 20a is different from the space between each of the plurality of insulating parts 40a. When being projected onto the X-Y plane, between each of the plurality of conductive parts 20a, at least one insulating part 40a is disposed. In the example, between each of the plurality of conductive parts 20a, two insulating parts 40a are disposed.

Each of the plurality of openings 20b is disposed between each of the plurality of conductive parts 20a. In the example, each of the plurality of openings 20b is in a trench shape extending in the Y-axis direction. Each of the plurality of openings 20b extends in the Y-axis direction and is arranged side by side in the X-axis direction. In the example, the second electrode 20 and the insulating layer 40 are in a stripe-like shape.

The second electrode 20 (the conductive part 20a) has, for example, light reflectivity. The light reflectance of the second electrode 20 is higher than the light reflectance of the first electrode 10. In the specification of the application, a state that has light reflectance higher than the light reflectance of the first electrode 10 is referred to as being light reflective.

Here, let's pay attention to a portion of two adjacent conductive parts 20a. The organic electroluminescent device 110 includes six insulating parts 40a in the portion. These six insulating parts 40a are set to a first insulating part 41 to a sixth insulating part 46, respectively. The second insulating part 42 is separated from the first insulating part 41 in the X-axis direction. The third insulating part 43 is provided between the first insulating part 41 and the second insulating part 42. The fourth insulating part 44 is provided between the second insulating part 42 and the third insulating part 43. The fifth insulating part 45 is provided between the third insulating part 43 and the fourth insulating part 44. The sixth insulating part 46 is provided between the third insulating part 43 and the fifth insulating part 45.

The organic light emitting layer 30 includes a first portion 30a provided on the upper face 10a of the first electrode 10 in between the first insulating part 41 and the third insulating part 43, and a second portion 30b provided on the upper face 10a of the first electrode 10 in between the second insulating part 42 and the fourth insulating part 44.

One of the plurality of conductive parts 20a is set to a first conductive part 21. Another one of the plurality of conductive parts 20a is set to a second conductive part 22. The first conductive part 21 is provided on the first portion 30a. The second conductive part 22 is provided on the second portion 30b. The second conductive part 22 is a conductive part 20a positioned adjacent to the first conductive part 21.

The organic light emitting layer 30 is electrically connected to the first electrode 10 via each of the plurality of openings 40b. The organic light emitting layer 30 comes into contact with each of the plurality of exposed parts 10p of the first electrode 10, for example, via each of the plurality of openings 40b. Consequently, the organic light emitting layer 30 is electrically connected to the first electrode 10.

The organic light emitting layer 30 is electrically connected to the second electrode 20. The organic light emitting layer 30 makes contact with, for example, each of the plurality of conductive parts 20a. Consequently, the organic light emitting layer 30 is electrically connected to the second electrode 20. In the specification of the application, "electrically connected to" includes, in addition to the case of direct contact, a case where another conductive member or the like is interposed.

A current is flown to the organic light emitting layer 30 using the first electrode 10 and the second electrode 20. Consequently, the organic light emitting layer 30 emits light. The organic light emitting layer 30 causes, for example, an electron and a hole to recombine when a current is flown to thereby generate an exciton. The organic light emitting layer 30 emits light, for example, while utilizing the ejection of light when the exciton is radiatively deactivated.

In the organic electroluminescent device 110, the portion of the organic light emitting layer 30 between the exposed part 10p and the conductive part 20a works as a light emitting region. In the example, the organic light emitting layer 30 has a plurality of light emitting regions between each of the plurality of exposed parts 10p and each of the plurality of conductive parts 20a. That is, in the example, the first portion 30a and the second portion 30b of the organic light emitting layer 30 work as light emitting regions. Emission light EL emitted from the light emitting regions goes to the outside of the organic electroluminescent device 110 via the first electrode 10. A part of the emission light EL is reflected by the second electrode 20 and goes to the outside via the organic light emitting layer 30 and the first electrode 10. That is, the organic electroluminescent device 110 is of a one-side light emission type.

In the organic electroluminescent device 110, outside light OL entering the device from the outside passes through the first electrode 10 and the insulating layer 40 in portions positioned between each of the plurality of conductive parts 20a. In this way, the organic electroluminescent device 110 causes the emission light EL to go to the outside and allows the outside light OL entering the organic electroluminescent device 110 from the outside to pass through. As described above, the organic electroluminescent device 110 has light permeability. Consequently, in the organic electroluminescent device 110, an image in a background can be visually recognized via the organic electroluminescent device 110. That is, the organic electroluminescent device 110 is a thin film-like or plate-like light source capable of being seen through.

In this way, by the organic electroluminescent device 110 according to the embodiment, a light transmissive organic electroluminescent device can be provided. When the organic electroluminescent device 110 is applied to illumination apparatuses, various new applications become possible by a function of allowing a background image to be seen through in addition to an illumination function.

The light transmissive part 50 is provided in a position that overlaps, when being projected onto the X-Y plane, with a first region AR1 between the third insulating part 43 and the fifth insulating part 45 of the first electrode 10. In the example, the first region AR1 is the region between the fifth insulating part 45 and the sixth insulating part 46 of the first electrode 10. The first region AR1 is, in more detail, in between the third insulating part 43 and the fifth insulating part 45 of the first electrode 10, a region between the third insulating part 43 and the insulating part 40a adjacent to it, when being projected onto the X-Y plane. In the example, over the first region AR1, the organic light emitting layer 30 extends. In the example, the light transmissive part 50 is provided on the organic light emitting layer 30. The light transmissive part 50 is provided on a portion of the organic light emitting layer 30 that overlaps with the first region AR1 when being projected onto the X-Y plane.

The light transmissive part 50 may be provided, for example, in the first region AR1 between each of the plurality of conductive parts 20a. The light transmissive part 50 may be provided, for example, in merely one place between each of the plurality of conductive parts 20a. The light transmissive part 50 may be provided, for example, in every two or more region AR1 in the plurality of first regions AR1 between each of the plurality of conductive parts 20a. The light transmissive part 50 may be formed of one layer, or may be formed by stacking a plurality of layers.

The light transmissive part 50 has light permeability. The light transmissive part 50 is, for example, transparent. The light transmissive part 50 modulates the phase of first light L1 passing through the first region AR1 relative to the phase of second light L2 passing through the second region AR2.

The second region AR2 is a region between the fourth insulating part 44 and the fifth insulating part 45 in the first electrode 10, when being projected onto the X-Y plane. In the organic electroluminescent device 110, the phase of the first light L1 passing through the first region AR1 is different from the phase of the second light L2 passing through the second region AR2. That is, in the organic electroluminescent device 110, the phase of light passing through a portion for which the light transmissive part 50 is provided is different from the phase of light passing through a portion for which no light transmissive part 50 is provided.

When the wavelength of light running in vacuum is set to $\lambda_0$, and the refractive index of the light transmissive part 50 is set to n, the wavelength of light passing through the light transmissive part 50 is shown by $\lambda_0/n$. Since the wavelength of light that does not pass through the light transmissive part 50 remains as $\lambda_0$, phase difference is generated. Therefore, the phase of the first light L1 can be modulated relative to the phase of the second light L2, by adjusting the refractive index n and thickness T of the light transmissive part 50 relative to the wavelength $\lambda_0$ of light running through vacuum.

The light transmissive part 50 makes, for example, the phase difference between the first light L1 and the second light L2 be not less than 90° and not more than 270°.

The phase difference between the first light L1 and the second light L2 can be obtained by, for example, a formula below.

$$g = 2 \cdot PI \cdot T(n-1)/\lambda_0$$

In the formula, "g" is a phase difference. "PI" is the circle ratio. "T" is the thickness of the light transmissive part 50. "n" is the refractive index of the light transmissive part 50.

In the light transmissive part 50, the thickness (the length in the Z-axis direction) and the refractive index are set so as to satisfy that $90° \le g \le 270°$ in the above formula. Consequently, the phase difference between the first light L1 and the second light L2 can be made to be not less than 90° and not more than 270°.

For example, a photosensitive polyimide coating agent is used for the light transmissive part 50. In the case, the refractive index n of the light transmissive part 50 is 1.66. For example, 0.55 μm that is an intense wavelength in the sunlight spectrum is used as the $\lambda_0$. At this time, a thickness T of the light transmissive part 50 may be adjusted to be from 0.208 μm to 0.625 μm, favorably, in order to achieve an antiphase, the thickness T may be adjusted to be 0.417 μm. Further, the refractive index n of the light transmissive part 50 can be set to be, for example, approximately in the range of 1 to 3. Note that the thickness T and the refractive index n can be arbitrarily set so that the phase difference g becomes $90° \le g \le 270°$.

The phase difference between the first light L1 and the second light L2 is preferably not less than 135° and not more than 225°, and 180°, or 180°+360°×n (n is a natural number) is most suitable. That is, setting the first light L1 to be in an antiphase relative to the second light L2 is most suitable.

In light transmissive organic electroluminescent devices, there is a configuration in which the organic light emitting layer 30 is provided on the first electrode 10 without providing an insulating layer 40. In such a configuration, for example, a portion of the organic light emitting layer 30 to be a light emitting region may be damaged in forming the second electrode 20 in some cases.

When the second electrode 20 is formed, for example, sputtering and evaporation methods are used. At this time, in some cases, a mask (for example, a metal mask) for patterning the second electrode 20 comes into contact with the organic light emitting layer 30 to thereby damage the organic light emitting layer 30. When the light emitting region is damaged, leak of the device or the like is generated. Therefore, for example, the yield of the organic light emitting device is lowered.

Furthermore, in light transmissive organic electroluminescent devices, narrowing the width of the conductive part 20a is advanced so that a background image can be observed better by suppression of the visibility of the conductive part 20a itself. At this time, in the formation of the second electrode 20, higher accuracy is required. However, when the formation accuracy of the second electrode 20 is enhanced, the risk of contact of the mask with the organic light emitting layer 30 rises. For example, when the distance between the mask and a target object is large, the formation accuracy is lowered by diffusing a material to be sputtered after passing through the mask. In order to enhance the formation accuracy in sputtering etc., the mask is required to be brought closer to the target object. Consequently, when the formation accuracy of the second electrode 20 is enhanced, the risk of contact of the mask with the organic light emitting layer 30 rises.

In contrast, in the organic electroluminescent device 110 according to the embodiment, the insulating layer 40 is included and the organic light emitting layer 30 is provided on the insulating layer 40. Furthermore, the upper face 30u of the organic light emitting layer 30 is positioned below the upper face 40u of the insulating part 40a. Consequently, in the organic electroluminescent device 110 according to the embodiment, even if the mask comes into contact with the organic light emitting layer 30 in forming the second electrode 20, the mask comes into contact with a portion not serving as a light emitting region. That is, the insulating layer 40 functions as a stopper of the mask in forming the second electrode 20.

Consequently, in the organic electroluminescent device 110, for example, the contact of the mask with the first portion 30a or the second portion 30b serving as a light emitting region of the organic light emitting layer 30 can be suppressed. In the organic electroluminescent device 110, for example, the damage of the first portion 30a or the second portion 30b serving as a light emitting region of the organic light emitting layer 30 in forming the second electrode 20, or the like can be suppressed. In the case of the organic electroluminescent device 110, for example, the yield can be enhanced, high reliability can be obtained, and a conductive part 20a having a narrow width can be formed with high accuracy.

Further, in the organic electroluminescent device 110, at least one insulating part 40a is provided between the first conductive part 21 and the second conductive part 22. Consequently, deflection of the mask in the portion between the first conductive part 21 and the second conductive part 22 can be suppressed. For example, the formation accuracy of the conductive part 20a can be enhanced.

As described above, in light transmissive organic electroluminescent devices, in order to make the second electrode 20 be seen hardly, it is requested to make the width of the conductive part 20a narrow. When the width of the conductive part 20a is made narrow, the area of the emission region is reduced. Consequently, for example, when the second electrode 20 is made in a stripe-like pattern shape, narrowing of the pitch of the plurality of conductive parts 20a is required while making the width of the conductive part 20a narrow, in order to obtain appropriate emission luminance while making the second electrode 20 be seen hardly. However, when the pitch is made narrow, the visibility of a transmission image lowers. For example, the transmission image blurs. It is considered that the phenomenon is caused, for example, by the diffraction of light.

The inventor of the application hardly examined the relationship between the pitch of the conductive part 20a and the shape of the insulating part 40a, and the lowering of the visibility of a transmission image. As the result, the inventor found that the degree of lowering of the visibility of a transmission image strengthened in a configuration in which a portion with the insulating part 40a and a portion without insulating part 40a is arranged side by side alternately between adjacent two conductive parts 20a. This is considered to be caused, for example, by the interference of light having passed through the organic electroluminescent device 110.

For example, it is also considered that the insulating part 40a is extended in the X-axis direction in a portion between adjacent two conductive parts 20a and the portion between adjacent two conductive parts 20a is buried with the insulating part 40a. In this case, the lowering of the visibility of a transmission image caused by the interference of light can be suppressed. However, the configuration of burying the portion with the insulating part 40a brings about, for example, the lowering of light permeability. For example, transparency lowers. Consequently, again the visibility of a transmission image lowers.

In contrast, in the organic electroluminescent device 110 according to the embodiment, the light transmissive part 50 is provided and the phase of the first light L1 is modulated relative to the phase of the second light L2. For example, the phase difference between the first light L1 and the second light L2 is set to be not less than 90° and not more than 270°. For example, the first light L1 is set to be in an antiphase relative to the second light L2. Consequently, in the organic electroluminescent device 110, the lowering of the visibility of a transmission image caused by the interference of light can be suppressed. Furthermore, for example, since it has the portion without the insulating part 40a between the fourth insulating part 44 and the fifth insulating part 45, the lowering of light permeability can also be suppressed as compared with the configuration of burying the portion with the insulating part 40a.

In the organic electroluminescent device 110 shown in FIG. 1, in a structure in which the insulating layer 10 and the light transmissive part 50 are disposed one-dimensionally at a period of $1/\nu_0$, the interference of light of the first light L1 and the second light L2 is considered in the configuration not including the light transmissive part 50. That is, there is considered a case where the phase of the first light L1 is the same as the phase of the second light L2. in the case, there is considered amplitude intensity of a transmission image that is an image formed by the first light L1 and the second light L2 in a region sufficiently separated as compared with the dimension of the opening of the light transmissive part 50. In the case, when considering merely a fundamental frequency component, the amplitude intensity of the transmission image can be represented, for example, by a (1) formula below.

$$F(\nu)=4/\pi\{\Gamma(\nu)/2+[(\Gamma(\nu+\nu_0))+\Gamma(\nu-\nu_0))]/2+\ldots \qquad (1)$$

In the (1) formula, "$\nu_0$" is a reciprocal number of a grid spacing (a pitch Pt2 of the insulating part 40a). "$\nu$" is the position of permeating light in the X-axis direction. $\Gamma$ is a gamma function.

As represented by the (1) formula, in the case where the phase of the first light L1 is the same relative to the phase of the second light L2, a high-order spectrum component is generated and the transmission image blurs.

Next, let's consider the interference of light of the first light L1 and the second light L2 in the organic electroluminescent device 110 including the light transmissive part 50. Here, a case where the first light L1 is in an antiphase relative to the second light L2 is considered. The amplitude intensity of a transmission image caused by the interference of light of the first light L1 and the second light L2 in this case is represented, for example, by a (2) formula below.

$$F(\nu)=(1/2)[(\Gamma(\nu+\nu_0/2))+\Gamma(\nu-\nu_0/2))] \qquad (2)$$

As represented by the (2) formula, in the case where the first light L1 is in an antiphase relative to the second light L2, a high-order spectrum component is not generated and the suppression of blur of the transmission image becomes possible.

In this way, by providing the light transmissive part 50 and modulating the phase of the first light L1 relative to the phase of the second light L2, the lowering of the visibility of a transmission image caused by the interference of light can be suppressed. For example, by setting the phase difference between the first light L1 and the second light L2 to be not less than 90° and not more than 270°, the lowering of the visibility of a transmission image caused by the interference of light can be suppressed to be excellent. Furthermore, the effect of suppressing the lowering of the visibility of a transmission image is maximized when the phase difference between the first light L1 and the second light L2 is set to be 180° or 180°+360°×n that brings about an antiphase.

As described above, in the organic electroluminescent device 110 according to the embodiment, high reliability is obtained. High formation accuracy of the conductive part 20a is obtained. In addition, also in the case where the pitch of the conductive part 20a or the pitch of the insulating part 40a is narrowed, the blur of a transmission image caused by the interference of light can be suppressed. High light permeability is obtained. High visibility of a transmission image is obtained.

In the above-described embodiment, the phase of the first light L1 that permeates the light transmissive part 50 is modulated relative to the phase of the second light L2 that permeates a portion without the light transmissive part 50 and the insulating part 40a. For example, the phase of the first light L1 that permeates the light transmissive part 50 may be modulated relative to the phase of third light L3 that permeates the fifth insulating part 45. For example, the first light L1 is set to be in an antiphase relative to the third light L3. In the configuration, too, the lowering of the visibility of a transmission image caused by the interference of light can be suppressed.

For example, when an optical path length of the fifth insulating part 45 by Nd1 and an optical path length of the light transmissive part 50 are set to Nd2, the wavelength of light in vacuum is set to $\lambda_0$, and the refractive index of the fifth insulating part 45 is set to n1, the thickness is set to T1, the refractive index of the light transmissive part 50 is set to n2 and the thickness is set to T2, the optical path length of Nd1 is $T1\times(n1/\lambda_0)$, and the optical path length of Nd2 is $T1\times(n2/\lambda_0)$. Therefore, the lowering of the visibility of a transmission image can be suppressed by adjusting respective refractive indices and thicknesses of the fifth insulating part 45 and the light transmissive part 50 to thereby adjust the phase difference thereof to be not less than 90° and not more than 270°. Also in this case, as described above, more favorably, the phase difference is 180° bringing about an antiphase.

For example, in a portion between the first conductive part 21 and the second conductive part 22, a light transmissive part 50 to be modulated relative to the phase of the second light L2 and a light transmissive part 50 to be modulated relative to the phase of the third light L3 may be provided. Consequently, the lowering of the visibility of a transmission image caused by the interference of light can be suppressed more suitably.

Figure 2:
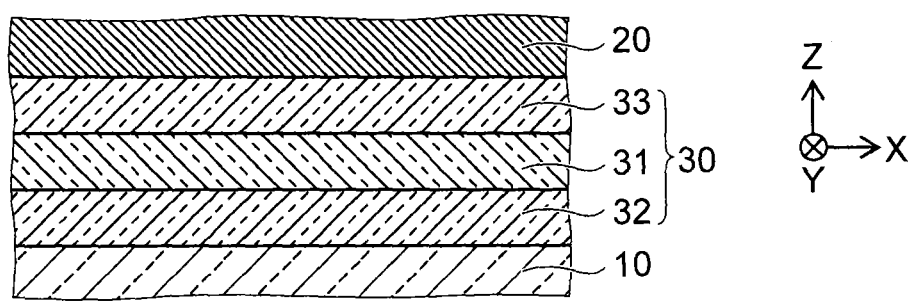
FIG. 2 is a schematic cross-sectional view showing a part of an organic electroluminescent device according to the first embodiment.

FIG. 2 is a schematic cross-sectional view showing a part of an organic electroluminescent device according to the first embodiment.

As shown in FIG. 2, the organic light emitting layer 30 includes a first layer 31. The organic light emitting layer 30 may further include, as appropriate, at least one of a second layer 32 and a third layer 33. The first layer 31 emits light including wavelengths of visible light. The second layer 32 is provided between the first layer 31 and the first electrode 10. The third layer 33 is provided between the first layer 31 and the second electrode 20.

For example, a material such as $Alq_3$ (tris(8-hydroxyquinolinato)aluminum), F8BT (poly(9,9-dioctylfluorene-co-benzothiadiazole) or PPV (poly(p-phenylenevinylene)) can be used for the first layer 31. A mixing material of a host material and a dopant added to the host material can be used for the first layer 31. As the host material, for example, CBP (4,4'-N,N'-bis(dicarbazolyl-biphenyl)), BCP (2,9-dimethyl-4,7-diphenyl-1,10-phenanthroline), TPD (4,4'-bis-N-3-methylphenyl-N-phenylaminobiphenyl), PVK (polyvinyl carbazole), PPT (poly(3-phenylthiophene)) or the like can be used as the host material. For example, Flrpic (iridium (III) bis(4,6-di-fluorophenyl)-pyridinate-N,C2'-picolinate), $Ir(ppy)_3$ (tris(2-phenylpyridine)iridium), Flr6 (bis(2,4-difluorophenylpyridinate)-tetrakis(1-pyrazolyl)borate-iridium (III) or the like can be used as a dopant material. The first layer 31 is not limited to layers formed of the above-described materials. The first layer is not limited to layers formed of these materials.

The second layer 32 functions as, for example, a hole injection layer. The hole injection layer includes at least any of, for example, PEDPOT: PPS (poly(3,4-ethylenedioxythiophene)-poly(styrenesulfonate)), CuPc (copper phthalocyanine), $MoO_3$ (molybdenumtrioxide), and the like. The second layer 32 functions as, for example, a hole transport layer. The hole transport layer includes at least any of, for example, α-NPD (4,4'-bis[N-(1-naphthyl)-N-phenylamino] biphenyl), TAPC (1,1-bis[4-[N,N-di(p-tolyl)amino]phenyl] cyclohexane), m-MTDATA (4,4',4"-tris[phenyl(m-tolyl) amino]triphenylamine), TPD (bis(3-methylphenyl)-N,N'-diphenylbenzidine), TCTA (4,4',4"-tri(N-carbazolyl) triphenylamine), and the like. The second layer 32 may have a stacked structure, for example, of a layer functioning as a hole injection layer and a layer functioning as a hole transport layer. The second layer 32 may include a layer other than the layer functioning as a hole injection layer and a layer functioning as a hole transport layer. The second layer 32 is not limited to layers formed of these materials.

The third layer 33 may include a layer functioning as, for example, an electron injection layer. The electron injection layer includes at least any of, for example, lithium fluoride, cesium fluoride, lithium quinoline complex, and the like. The third layer 33 can include a layer functioning as, for example, an electron transport layer. The electron transport layer includes at least any of, for example, Alq3 (tris(8-quinolinolate)aluminum (III)), BAlq (bis(2-methyl-8-quinolilate)(p-phenylphenolate)aluminum), Bphen (bathophenanthroline), 3TPYMB (tris[3-(3-pyridyl)-mesityl]borane), and the like. The third layer 33 may have a stacked structure, for example, of a layer functioning as an electron injection layer and a layer functioning as an electron transport layer. The third layer 33 may include a layer other than the layer functioning as an electron injection layer and a layer functioning as an electron transport layer. The third layer 33 is not limited to layers formed of these materials.

For example, the light emitted from the organic light emitting layer 30 is substantially white light. That is, the light emitted from the organic electroluminescent device 110 is white light. Here, "white light" is substantially white and also includes, for example, reddish, yellowish, greenish, bluish, and purplish white light.

The first electrode 10 includes an oxide containing at least one device selected from the group consisting of, for example, In, Sn, Zn and Ti. For example, a film of indium oxide, zinc oxide, tin oxide or indium tin oxide (ITO), a film manufactured using a conductive glass containing fluorine-doped tin oxide (FTO) or indium zinc oxide (such as NESA), gold, platinum, silver, copper or the like can be used for the first electrode 10. The first electrode 10 functions as, for example, an anode. The first electrode 10 is not limited to electrodes formed of these materials.

The second electrode 20 includes at least any of, for example, aluminum and silver. For example, an aluminum film is used for the second electrode 20. Furthermore, an alloy of silver and magnesium may be used for the second electrode 20. Calcium may be added to the alloy. The second electrode 20 functions as, for example, a cathode. The second electrode 20 is not limited to electrodes formed of these materials.

It is also possible to set the first electrode 10 as a cathode, to set the second electrode 20 as an anode, to cause the second layer 32 to function as an electron injection layer or an electron transport layer, and to cause the third layer 33 to function as a hole injection layer or a hole transport layer.

For example, an insulating resin material such as polyimide resin or acrylic resin, or an insulating inorganic material such as a silicon oxide film (such as $SiO_2$), a silicon nitride film (such as SiN) or a silicon oxynitride film is used for the insulating layer 40. Note that the insulating layer 40 is not limited to layers formed of these materials.

For example, polyimide resin, polysiloxane resin, a silicon oxide film (such as $SiO_2$), a silicon nitride film (such as SiN), a silicon oxynitride film or the like is used for the light transmissive part 50. Note that the light transmissive part 50 is not limited to parts formed of these materials.

The thickness of the first electrode 10 (the length in the Z-axis direction) is, for example, not less than 10 nm and not more than 500 nm. The thickness of the insulating part 40a is, for example, not less than 1 μm and not more than 100 μm. The thickness of the organic light emitting layer 30 is, for example, not less than 10 nm and not more than 1 μm. The thickness of the second electrode 20 (the conductive part 20a) is, for example, not less than 10 nm and not more than 500 nm. The thickness (height) of each of the plurality of conductive parts 20a is substantially constant.

A width W1 (the length in the X-axis direction) of the conductive part 20a is, for example, not less than 100 nm and not more than 2000 μm. A pitch Pt1 of the plurality of conductive parts 20a is, for example, not less than 100 nm and not more than 2000 μm. The pitch Pt1 is, for example, the distance in the X-axis direction between centers of two adjacent conductive parts 20a in the X-axis direction. The pitch Pt1 of each of the plurality of conductive parts 20a is, for example, substantially constant. That is, each of the plurality of conductive parts 20a is arranged side by side substantially at regular intervals in the X-axis direction. A width W2 of the insulating part 40a is, for example, not less than 100 nm and not more than 2000 μm. The pitch Pt2 of the insulating part 40a is, for example, not less than 100 nm and not more than 2000 μm. The pitch Pt2 of each of the plurality of insulating parts 40a is, for example, substantially constant. That is, each of the plurality of insulating parts 40a is arranged side by side substantially at regular intervals in the X-axis direction.

When the light transmissive part 50 is provided on the organic light emitting layer 30, the thickness of the light transmissive part 50 is not more than the thickness of the insulating part 40a. Consequently, for example, in forming the second electrode 20, the contact of the mask with the light transmissive part 50 can be suppressed.

Figure 3A:
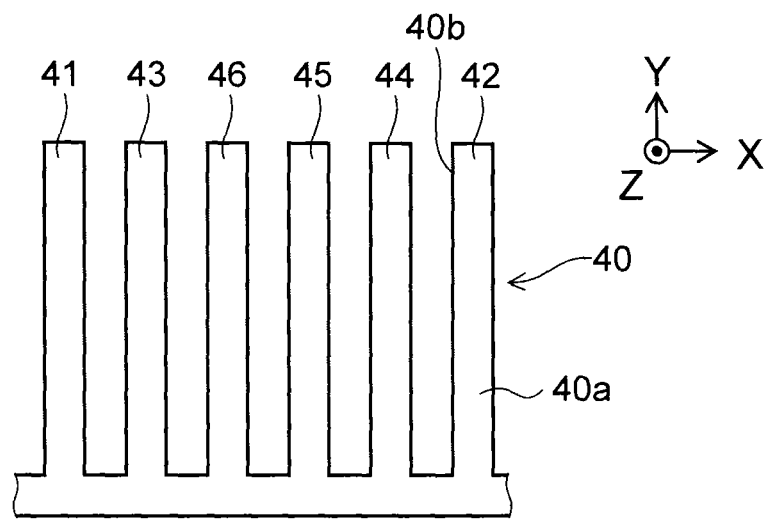
FIGS. 3A and 3B are schematic plan views showing a part of other organic electroluminescent devices according to the first embodiment.
Figure 3B:
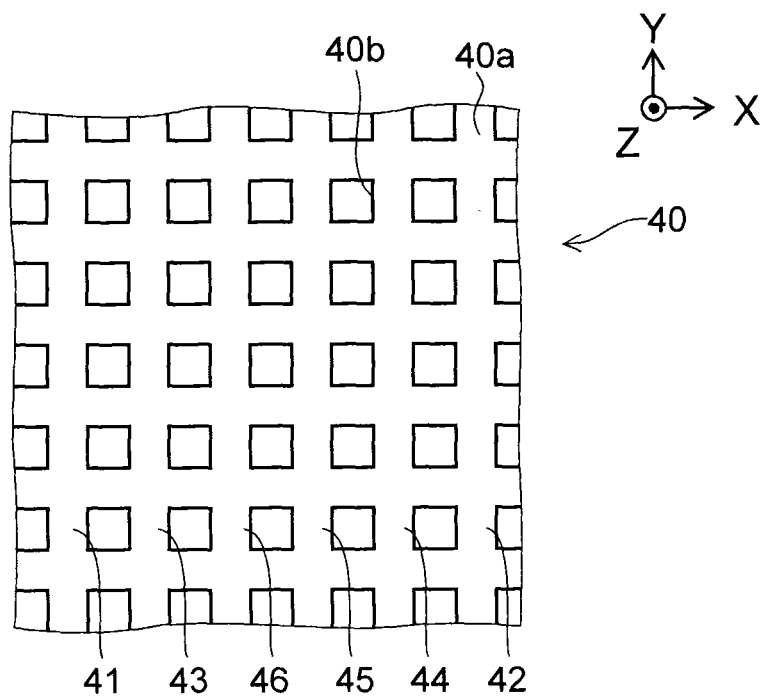

FIGS. 3A and 3B are schematic plan views showing a part of other organic electroluminescent devices according to the first embodiment.

As shown in FIG. 3A, the insulating part 40a of the insulating layer 40 may be in a comb-tooth shape. That is, the insulating layer 40 may include a plurality of portions that are arranged side by side in the X-axis direction and a portion linking these portions. In the case, portions arranged side by side in the X-axis direction serve as the first insulating part 41 to the sixth insulating part 46.

As shown in FIG. 3B, the insulating part 40a of the insulating layer 40 may be in a grid-like shape. In the example, the insulating layer 40 includes a plurality of openings 40b arrayed in a two-dimensional matrix shape. In the insulating part 40a, a plurality of portions that extend in the Y-axis direction and are arranged side by side in the X-axis direction and a plurality of portions that extend in the X-axis direction and are arranged side by side in the Y-axis direction intersect with each other. Also in this case, portions arranged side by side in the X-axis direction work as the first insulating part 41 to the sixth insulating part 46. As described above, each of the first insulating part 41 to the sixth insulating part 46 may be a part of the insulating part 40a being arranged side by side in the X-axis direction.

In the same way, the conductive part 20a of the second electrode 20 may also be in a comb-tooth shape, a grid-like shape or the like. Each of the first conductive part 21 and the second conductive part 22 may be a part of the conductive part 20a.

Figure 4A:
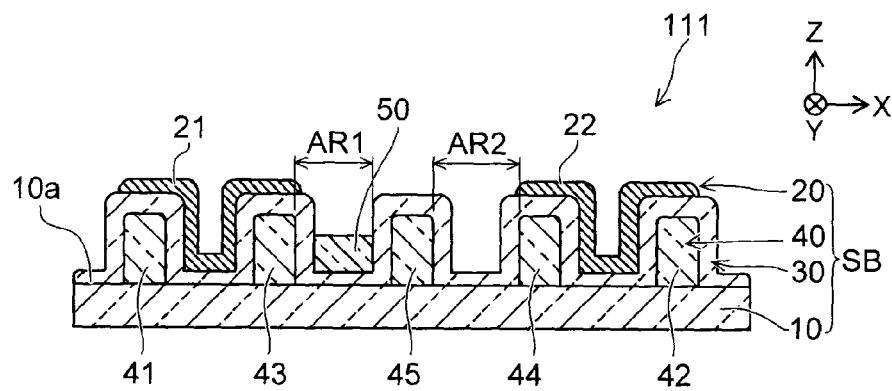
FIGS. 4A to 4C are schematic cross-sectional views showing other organic electroluminescent devices according to the first embodiment.
Figure 4B:
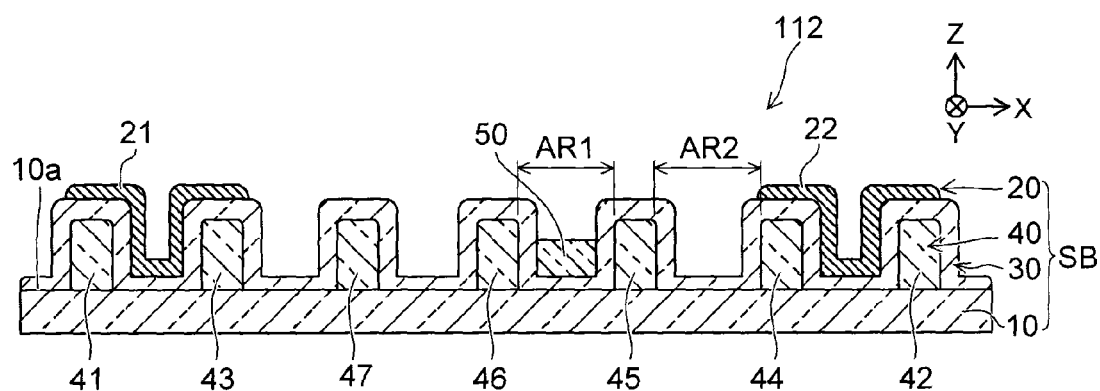
Figure 4C:
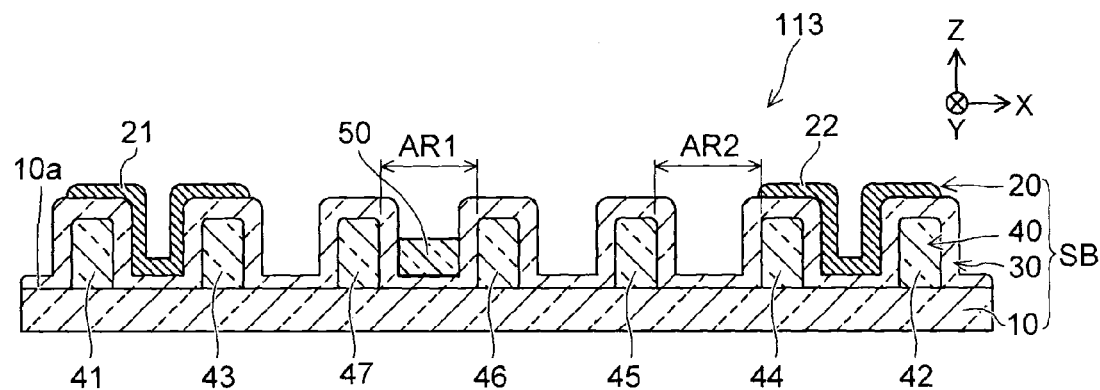

FIGS. 4A to 4C are schematic cross-sectional views showing other organic electroluminescent devices according to the first embodiment.

As an organic electroluminescent device 111 shown in FIG. 4A, the insulating layer 40 may include at least the first insulating part 41 to the fifth insulating part 45.

As shown in FIG. 4B, in an organic electroluminescent device 112, a seventh insulating part 47 is provided between the third insulating part 43 and the sixth insulating part 46. In this way, more insulating parts 40a may be provided between the third insulating part 43 and the fourth insulating part 44.

As shown in FIG. 4C, in an organic electroluminescent device 113, the seventh insulating part 47 is provided between the fourth insulating part 44 and the fifth insulating part 45. In this way, more insulating parts 40a may be provided between the fourth insulating part 44 and the fifth insulating part 45. For example, when the distance between the first conductive part 21 and the second conductive part 22 is long, a plurality of light transmissive parts 50 may be provided between the first conductive part 21 and the second conductive part 22.

Figure 5A:
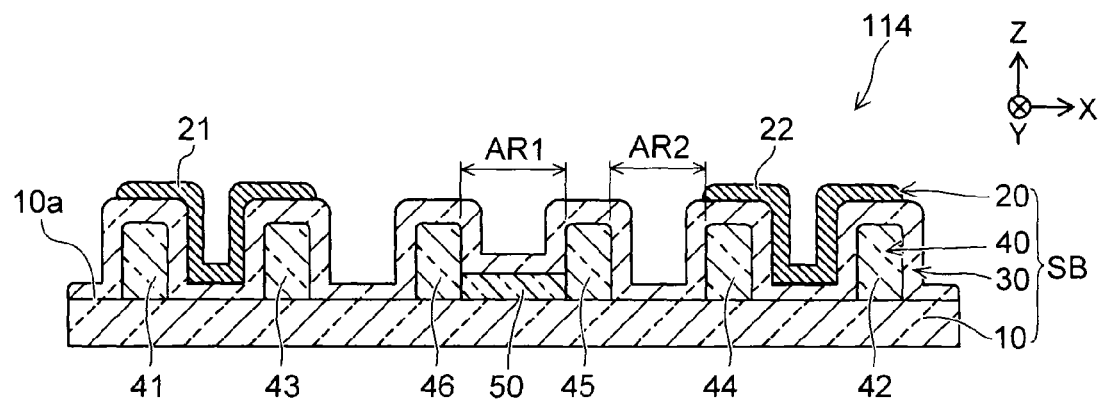
FIGS. 5A to 5C are schematic cross-sectional views showing other organic electroluminescent devices according to the first embodiment.
Figure 5B:
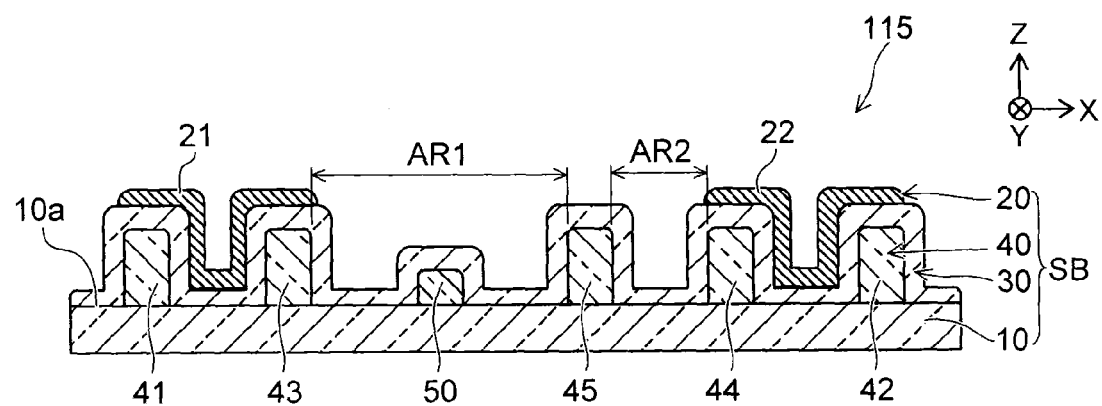
Figure 5C:
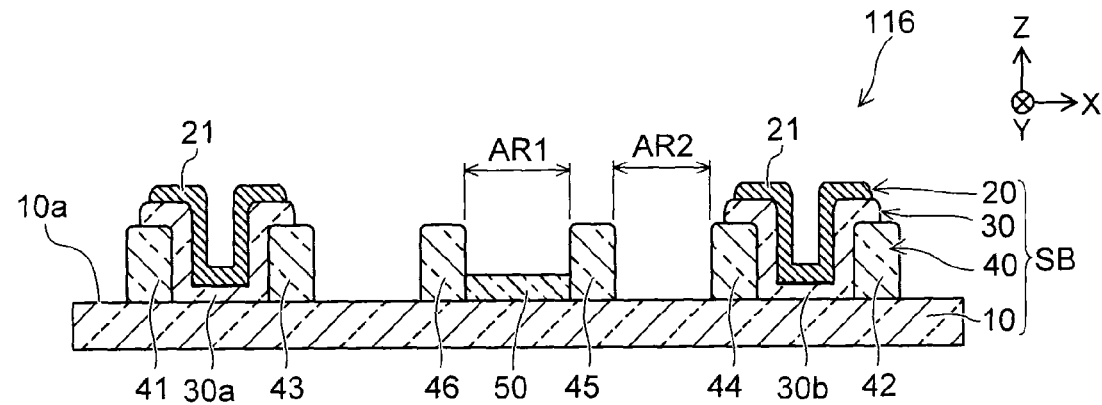

FIGS. 5A to 5C are schematic cross-sectional views showing other organic electroluminescent devices according to the first embodiment.

As an organic electroluminescent device 114 shown in FIG. 5A, the light transmissive part 50 may be provided on the upper face 10a of the first electrode 10. In other words, the light transmissive part 50 may be provided between the first electrode 10 and the organic light emitting layer 30.

As shown in FIG. 5B, in an organic electroluminescent device 115, the light transmissive part 50 is provided on the upper face 10a and includes substantially the same material as that of the insulating layer 40 (the insulating part 40a). The thickness of the light transmissive part 50 is different from the thickness of the insulating part 40a. The width of the light transmissive part 50 is substantially the same as the width of the insulating part 40a. In the example, the light transmissive part 50 is arranged side by side with each of the plurality of insulating parts 40a at substantially regular intervals in the X-axis direction. That is, in the example, one of the plurality of insulating parts 40a is used as the light transmissive part 50. In this way, the insulating part may be used as the light transmissive part 50 by changing the height of one of the plurality of insulating parts 40a.

As an organic electroluminescent device 116 shown in FIG. 5C, the organic light emitting layer 30 may not be provided on the whole of the insulating layer 40. It is sufficient that the organic light emitting layer 30 includes at least the first portion 30a between the first insulating part 41 and the third insulating part 43, and the second portion 30b between the second insulating part 42 and the fourth insulating part 44.

Figure 6A:
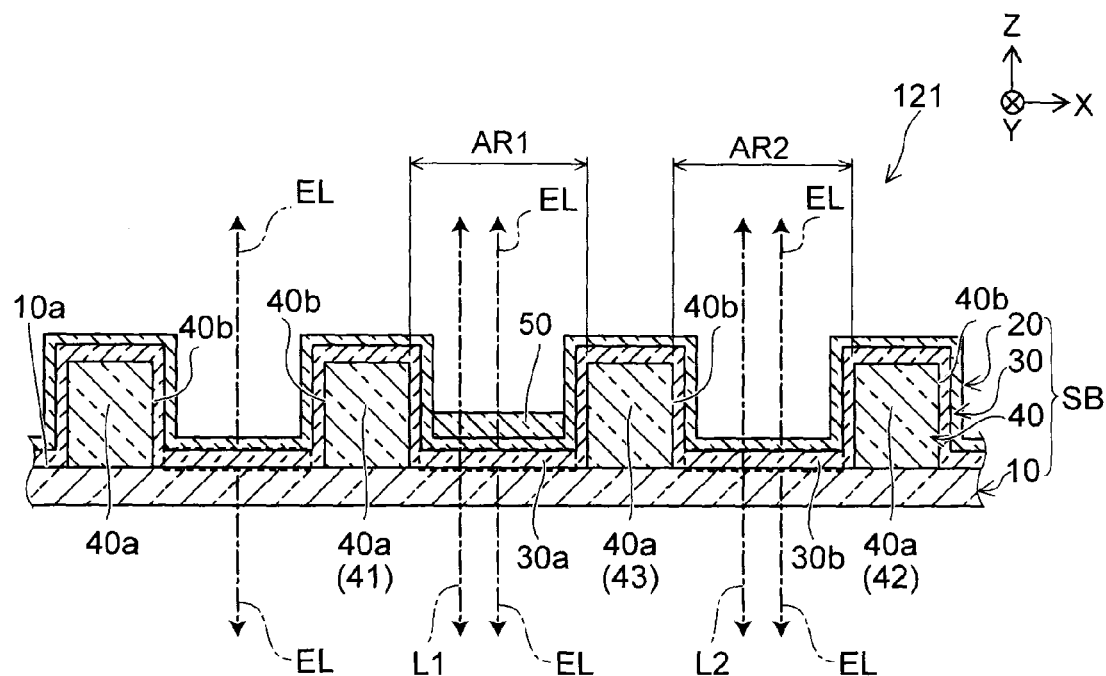
FIGS. 6A and 6B are schematic views showing another organic electroluminescent device according to the first embodiment.
Figure 6B:
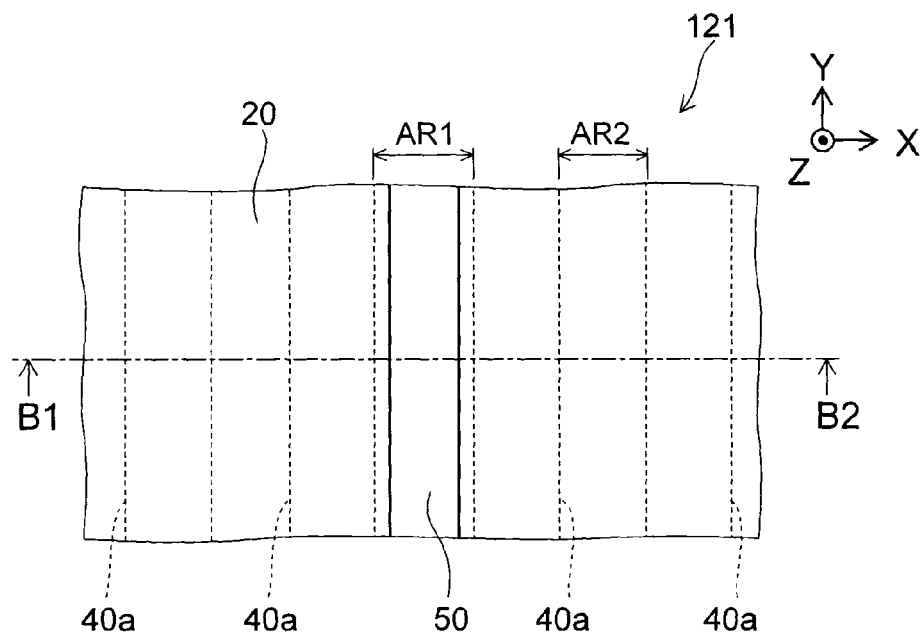

FIGS. 6A and 6B are schematic views showing another organic electroluminescent device according to the first embodiment.

FIG. 6A is a schematic cross-sectional view of an organic electroluminescent device 121, and FIG. 6B is a schematic plan view of the organic electroluminescent device 121. FIG. 6A is a cross-section along a B1-B2 line in FIG. 6B.

As shown in FIGS. 6A and 6B, in the organic electroluminescent device 121, the second electrode 20 is provided on the organic light emitting layer 30. For example, the second electrode 20 is provided on the whole of the organic light emitting layer 30. In the example, the second electrode 20 has light permeability. The second electrode 20 is, for example, transparent.

Consequently, in the organic electroluminescent device 121, when a current is flown to the organic light emitting layer 30 by using the first electrode 10 and the second electrode 20, emission light EL emitted from the light emitting region goes out of the organic electroluminescent device 121 via the first electrode 10, and goes out of the organic electroluminescent device 121 via the second electrode 20. That is, the organic electroluminescent device 121 is of a double-side light emission type.

In the organic electroluminescent device 121, one of the plurality of insulating parts 40a is set to a first insulating part 41. Another insulating part 40a separated from the first insulating part 41 is set to a second insulating part 42. An insulating part 40a between the first insulating part 41 and the second insulating part 42 is set to a third insulating part 43.

A portion provided on the upper face 10a in between the first insulating part 41 and the third insulating part 43 in the organic light emitting layer 30 is set to a first portion 30a. A portion provided on the upper face 10a in between the second insulating part 42 and the third insulating part 43 in the organic light emitting layer 30 is set to a second portion 30b.

The light transmissive part 50 is provided in a portion that overlaps, when being projected onto a plane parallel to the X-Y plane, with a first region AR1 between the first insulating part 41 and the third insulating part 43 in the first electrode 10. In the example, the light transmissive part 50 is provided on a portion that overlaps with the first region AR1 of the second electrode 20. The light transmissive part 50 modulates the phase of the first light L1 permeating the first region AR1 relative to the phase of the second light L2 permeating the second region AR2. In the example, the second region AR2 is a region between the second insulating part 42 and the third insulating part 43 in the first electrode 10. As described above, the light transmissive part 50 makes, for example, the phase of the first light L1 be an antiphase relative to the phase of the second light L2.

Consequently, also in the organic electroluminescent device 121 according to the embodiment, high visibility of a transmission image can be obtained.

For example, material explained regarding the first electrode 10 can be used for the light transmissive second electrode 20. Furthermore, the light transmissive second electrode 20 may be formed of, for example, a metal material such as MgAg. In the metal material, the thickness of the second electrode 20 is set to be not less than 5 nm and not more than 20 nm. Consequently, suitable light permeability can be obtained.

Figure 7A:
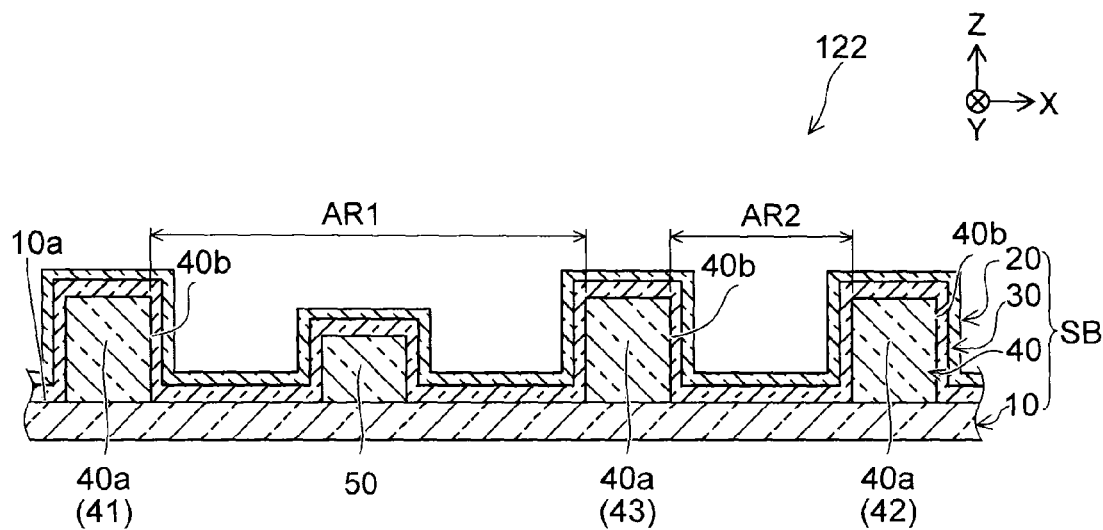
FIGS. 7A to 7C are schematic cross-sectional views showing other organic electroluminescent devices according to the first embodiment.
Figure 7B:
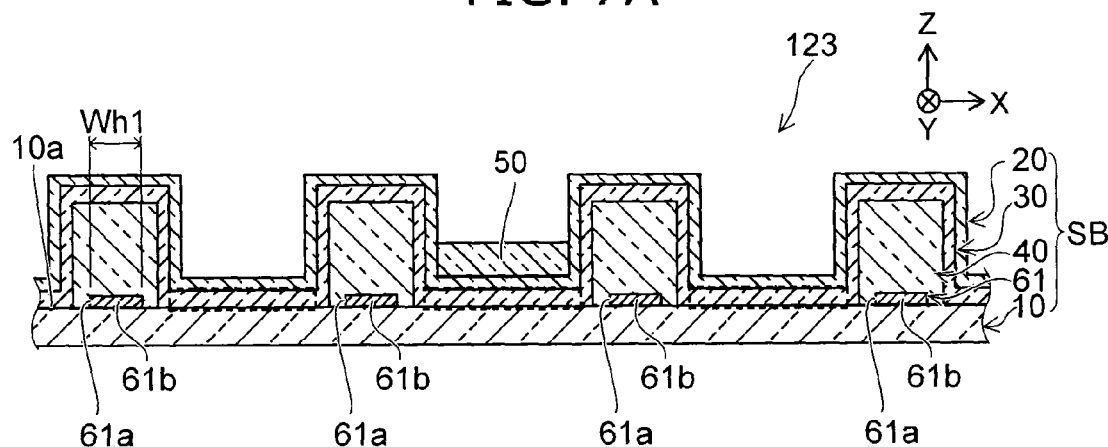
Figure 7C:
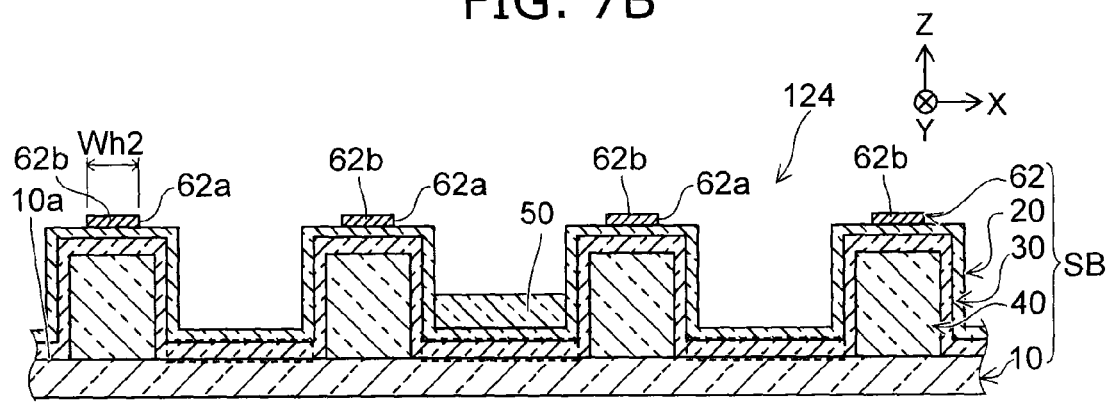

FIGS. 7A to 7C are schematic cross-sectional views showing other organic electroluminescent devices according to the first embodiment.

As an organic electroluminescent device 122 shown in FIG. 7A, in a device of a double-side light emission type, the insulating part 40a may be used as the light transmissive part 50. That is, in the organic electroluminescent device 122, the light transmissive part 50 is provided on the first electrode 10 and includes the same material as that of the insulating layer 40. Further, a length of the light transmissive part 50 in the direction perpendicular to the upper face 10a is different from a length of the insulating layer 40 in the direction perpendicular to the upper face 10a.

As shown in FIG. 7B, in an organic electroluminescent device 123, the stacked body SB further includes a first wiring layer 61. The first wiring layer 61 is provided between the first electrode 10 and the insulating layer 40. The first wiring layer 61 has an opening 61a and a wiring part 61b. The opening 61a allows a part of the first electrode 10 to be exposed. The first wiring layer 61 has, for example, a plurality of openings 61a and a plurality of wiring parts 61b. In the example, each of the plurality of openings 61a extends in the Y-axis direction and is arranged side by side in the X-axis direction. The plurality of wiring parts 61b are provided between each of the plurality of openings 61a. That is, in the example, the first wiring layer 61 has a pattern shape of a stripe-like pattern. Each of the plurality of wiring parts 61b is disposed, for example, in a position that overlaps with each of the plurality of insulating parts 40a, when being projected onto the X-Y plane. Each of the plurality of wiring parts 61b may not necessarily overlap with each of the plurality of insulating parts 40a.

The first wiring layer 61 is electrically connected to the first electrode 10. The first wiring layer 61 makes contact with, for example, the first electrode 10. The conductivity of the first wiring layer 61 is higher than the conductivity of the first electrode 10. The first wiring layer 61 has light reflectivity. The light reflectance of the first wiring layer 61 is higher than the light reflectance of the first electrode 10. The first wiring layer 61 is, for example, made of a metal wiring. The first wiring layer 61 functions as, for example, an auxiliary electrode that transmits a current flowing to the first electrode 10. Consequently, in the organic electroluminescent device 123, for example, a current volume flowing in the direction parallel to the upper face 10a of the first electrode 10 can be made more uniform. For example, the emission luminance in the plane can be made more uniform.

A width Wh1 (the length in the X-axis direction) of the wiring part 61b is, for example, not less than 100 nm and not more than 2000 μm. In the example, the pitch of each of the plurality of wiring parts 61b is substantially the same as the pitch of each of the plurality of insulating parts 40a. The pitch of each of the plurality of wiring parts 61b may be set, for example, to be integral multiple of the pitch of each of the plurality of insulating parts 40a. That is, the wiring part 61b may be provided in every two or three insulating part 40a. The first wiring layer 61 may be provided on a face opposite to the upper face 10a of the first electrode 10. The pattern shape of the first wiring layer 61 may be a grid-like shape.

The first wiring layer 61 contains at least one device selected from the group consisting, for example, of Mo, Ta, Nb, Al, Ni and Ti. The first wiring layer 61 can be made to be a mixed film containing, for example, the device selected from the group. The first wiring layer 61 can be made to be a stacked film containing these devices. As the first wiring layer 61, for example, a stacked film of Nb/Mo/Al/Mo/Nb can be used. The first wiring layer 61 functions as, for example, an auxiliary electrode that suppresses the potential drop of the first electrode 10. The first wiring layer 61 can function as a lead electrode for supplying a current.

As shown in FIG. 7C, in an organic electroluminescent device 124, the stacked body SB further includes a second wiring layer 62. The second wiring layer 62 is provided on the second electrode 20. The second wiring layer 62 has an opening 62a and a wiring part 62b. The opening 62a allows a part of the second electrode 20 to be exposed. The second wiring layer 62 has, for example, a plurality of openings 62a and a plurality of wiring parts 62b. In the example, each of the plurality of openings 62a extends in the Y-axis direction and is arranged side by side in the X-axis direction. The plurality of wiring parts 62b is provided between each of the plurality of openings 62a. That is, in the example, the second wiring layer 60 has a pattern shape of a stripe-like shape. In the example, each of the plurality of wiring parts 62b is disposed in a position that overlaps with each of the plurality of insulating parts 40a, when being projected onto the X-Y plane. Each of the plurality of wiring parts 62b may be disposed, for example, in a position that does not overlap with each of the plurality of insulating parts 40a, when being projected onto the X-Y plane.

The second wiring layer 62 is electrically connected to the second electrode 20. The second wiring layer 62 contacts, for example, with the second electrode 20. The conductivity of the second wiring layer 62 is higher than the conductivity of the second electrode 20. The second wiring layer 62 has light reflectivity. The light reflectance of the second wiring layer 62 is higher than the light reflectance of the second electrode 20. The second wiring layer 62 is formed of, for example, a metal wiring. The second wiring layer 62 functions as, for example, an auxiliary electrode that conveys a current flowing to the second electrode 20. Consequently, in the organic electroluminescent device 124, for example, a current volume flowing in the X-Y plane direction of the second electrode 20 can be made more uniform. For example, the emission luminance in the plane can be made more uniform.

A width Wh2 (the length in the X-axis direction) of the wiring part 62b is, for example, not less than 100 nm and not more than 2000 µm. In the example, each of the plurality of wiring parts 62b is disposed in a position that overlaps with each of the plurality of insulating parts 40a, when being projected onto the X-Y plane. The wiring part 62b may be provided, for example, in every two or three insulating part 40a.

The second wiring layer 62 may be provided, for example, between the second electrode 20 and the organic light emitting layer 30. The pattern shape of the second wiring layer 62 may by a grid-like shape. For example, materials explained regarding the first wiring layer 61 can be used for the second wiring layer 62.

Figure 8:
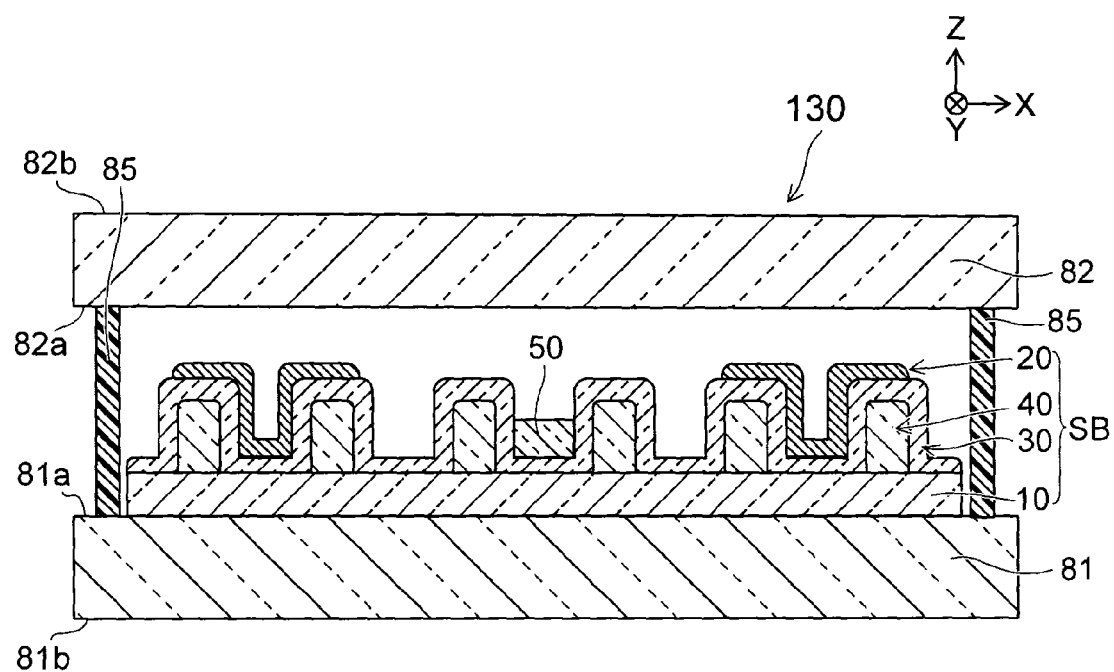
FIG. 8 is a schematic cross-sectional view showing another organic electroluminescent device according to the first embodiment.

FIG. 8 is a schematic cross-sectional view showing another organic electroluminescent device according to the first embodiment.

As shown in FIG. 8, an organic electroluminescent device 130 further includes a first substrate 81, a second substrate 82, and a seal part 85.

The first electrode 10 is provided on the first substrate 81. The first substrate 81 includes a first major surface 81a and a second major surface 81b. The second major surface 81b is, for example, a face positioned on the side opposite to the first major surface 81a. The second major surface 81b is, for example, parallel to the first major surface 81a. The stacked body SB is provided on the first major surface 81a of the first substrate 81. The first substrate 81 has light permeability. The second substrate 82 is provided on the stacked body SB, and faces the first substrate 81. The second substrate 82 includes a third major surface 82a and a fourth major surface 82b. The third major surface 82a faces the first major surface 81a. The fourth major surface 82b is, for example, a face positioned on the side opposite to the third major surface 82a. The fourth major surface 82b is, for example, parallel to the third major surface 82a. The third major surface 82a and the fourth major surface 82b are, for example, parallel to the first major surface 81a. The second substrate 82 has light permeability. In the example, the configuration of the stacked body SB is the same as the configuration explained regarding the organic electroluminescent device 110. The configuration of the stacked body SB may be any of the configurations explained regarding the organic electroluminescent devices 111 to 116, 118a, and 121 to 124.

The seal part 85 is, for example, annularly provided along peripheries of the first substrate 81 and the second substrate 82, and unites the first substrate 81 with the second substrate 82. Consequently, the stacked body SB is sealed with the first substrate 81 and the second substrate 82. In the organic electroluminescent device 130, the distance between the first substrate 81 and the second substrate 82 in the Z-axis direction is regulated by the seal part 85. The configuration can be realized, for example, by incorporating a particulate spacer (illustration is omitted) in the seal part 85. For example, by dispersing a plurality of particulate spacers in the seal part 85, and, by diameters of the plurality of spacers, the distance between the first substrate 81 and the second substrate 82 is regulated.

In the organic electroluminescent device 130, the thickness of the seal part 85 (the length along the Z-axis direction) is, for example, not less than 5 µm and not more than 100 µm. Preferably, the thickness is, for example, not less than 10 µm and not more than 20 µm. Consequently, for example, permeation of moisture or the like can be suppressed. The thickness of the seal part 85 is, for example, substantially the same as the diameter of the spacer dispersed in the seal part 85.

In organic electroluminescent devices, there is a configuration in which a concave part for housing a stacked body SB is provided under the second substrate 82. In the configuration, formation of the second substrate 82 becomes hard. For example, the formation leads to the increase in cost of the organic electroluminescent device.

In contrast, in the organic electroluminescent device 130 according to the embodiment, the distance between the first substrate 81 and the second substrate 82 is regulated by the seal part 85. Consequently, for example, a flat plate-like second substrate 82 can be used. For example, the second substrate 82 can be formed easily. The increase in cost of the organic electroluminescent device 130 can be suppressed.

The space between the stacked body SB and the second substrate 82 is filled, for example, with inert gas or the like. A desiccant or the like may be provided between the stacked body SB and the second substrate 82. The space between the stacked body SB and the second substrate 82 may be, for example, an air layer. In the space between the stacked body SB and the second substrate 82, a high vacuum degree may be set. In the space between the stacked body SB and the second substrate 82, for example, a liquid organic sealing agent or the like may be filled.

Also in the organic electroluminescent device 130 according to the embodiment, high visibility of a transmission image can be obtained.

For example, a glass substrate, a resin substrate or the like is used as the first substrate 81 and the second substrate 82. For example, an ultraviolet ray-curable resin or the like is used for the seal part 85.

Figure 9A:
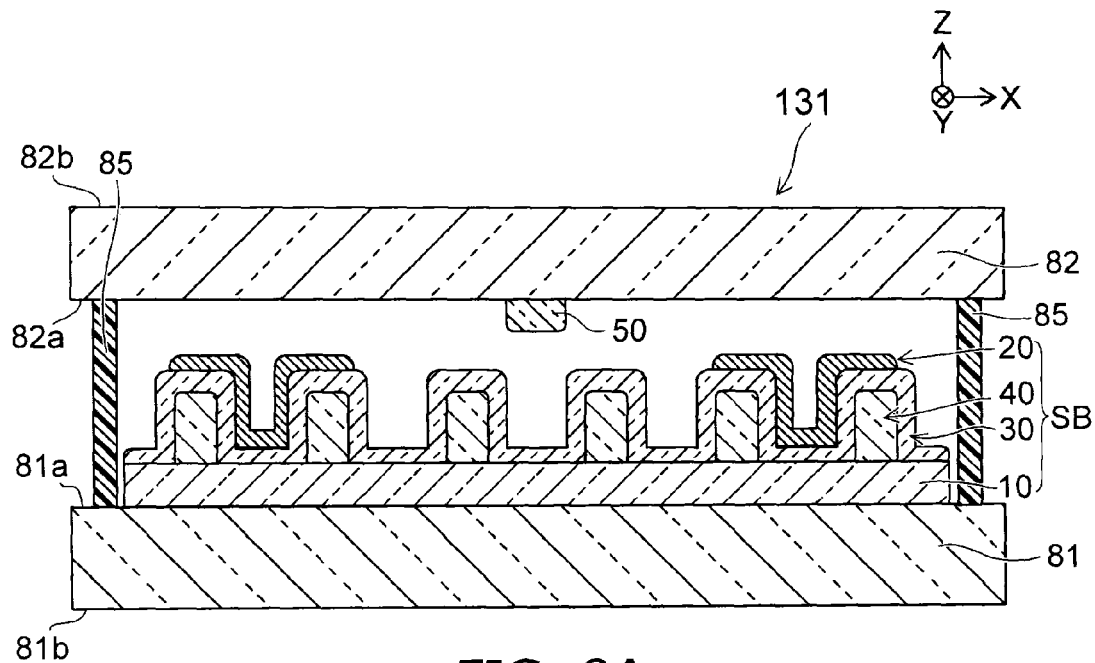
FIGS. 9A and 9B are schematic cross-sectional views showing other organic electroluminescent devices according to the first embodiment.
Figure 9B:
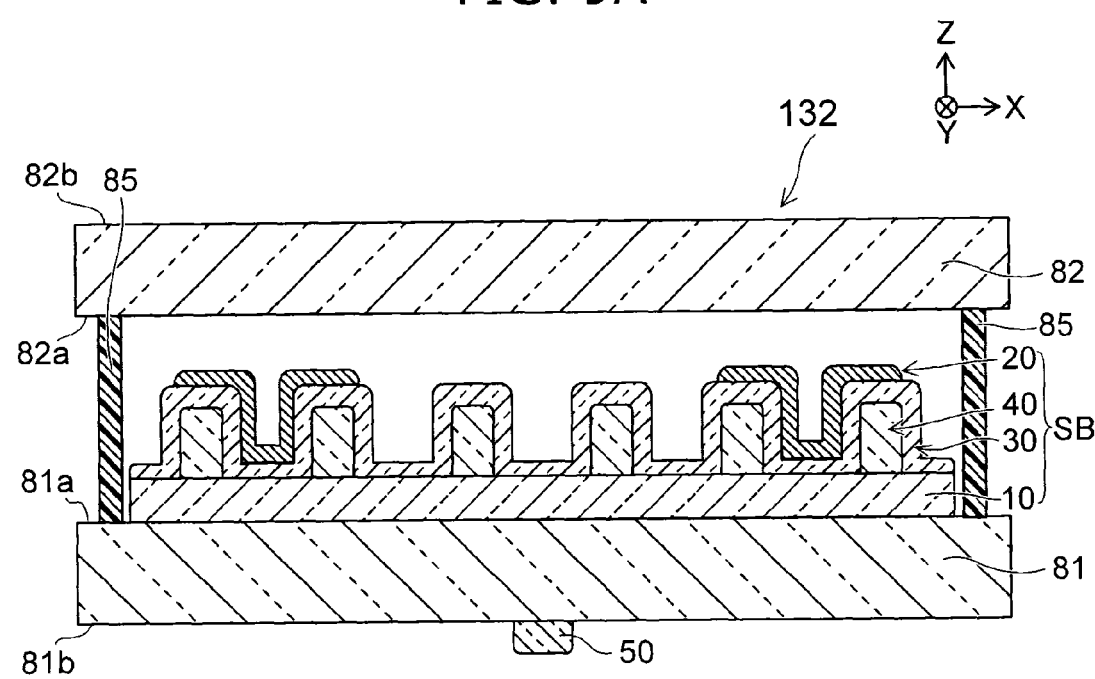

FIGS. 9A and 9B are schematic cross-sectional views showing other organic electroluminescent devices according to the first embodiment.

As an organic electroluminescent device 131 shown in FIG. 9A, the light transmissive part 50 may be provided under the second substrate 82. In the example, the light transmissive part 50 is provided on the third major surface 82a of the second substrate 82. The light transmissive part 50 may be provided on the fourth major surface 82b of the second substrate 82.

As an organic electroluminescent device 132 shown in FIG. 9B, the light transmissive part 50 may be provided over the first substrate 81. In the example, the light transmissive part 50 is provided on the second major surface 81b of the first substrate 81. The light transmissive part 50 may be provided on the first major surface 81a of the first substrate 81.

As described above, the position in which the light transmissive part 50 is to be provided may be an arbitrary position that overlaps with the first region AR1, when being projected onto the X-Y plane.

Second Embodiment

Figure 10:
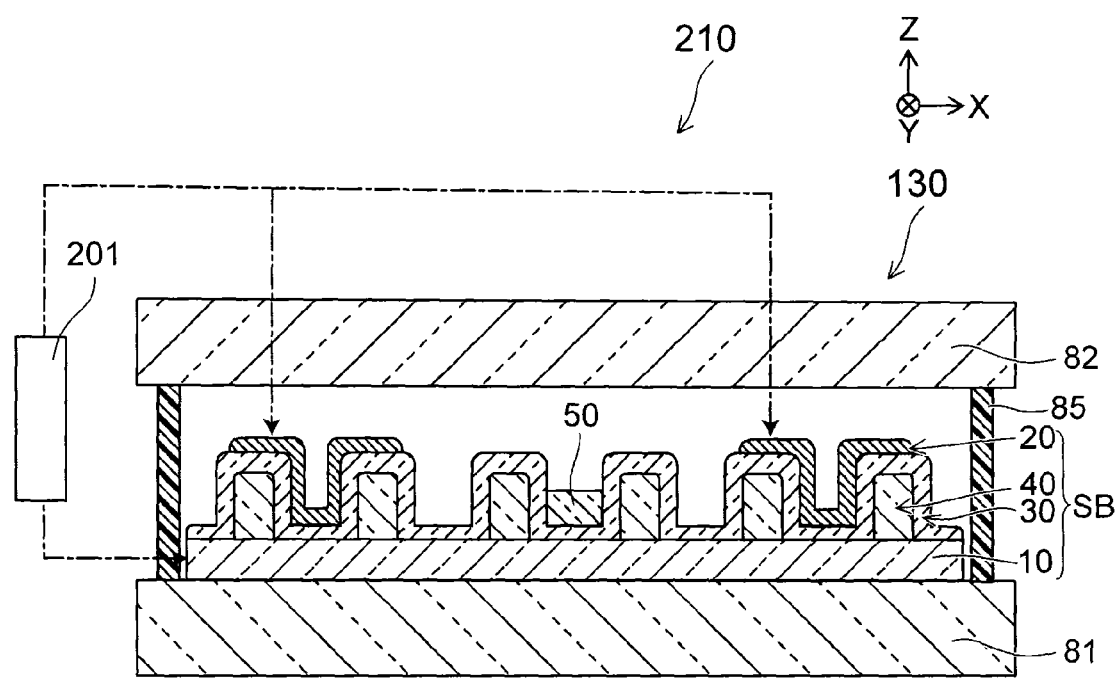
FIG. 10 is a schematic view showing an illumination apparatus according to a second embodiment.

FIG. 10 is a schematic view showing an illumination apparatus according to a second embodiment.

As shown in FIG. 10, an illumination apparatus 210 according to the embodiment includes the organic electroluminescent device according to the first embodiment (for example, the organic electroluminescent device 130) and a power source 201.

The power source 201 is electrically connected to the first electrode 10 and the second electrode 20. The power source 201 supplies a current to the organic light emitting layer 30 via the first electrode 10 and the second electrode 20.

An illumination apparatus having high visibility of a transmission image can be provided by using the illumination apparatus 210 according to the embodiment.

Third Embodiment

Figure 11A:
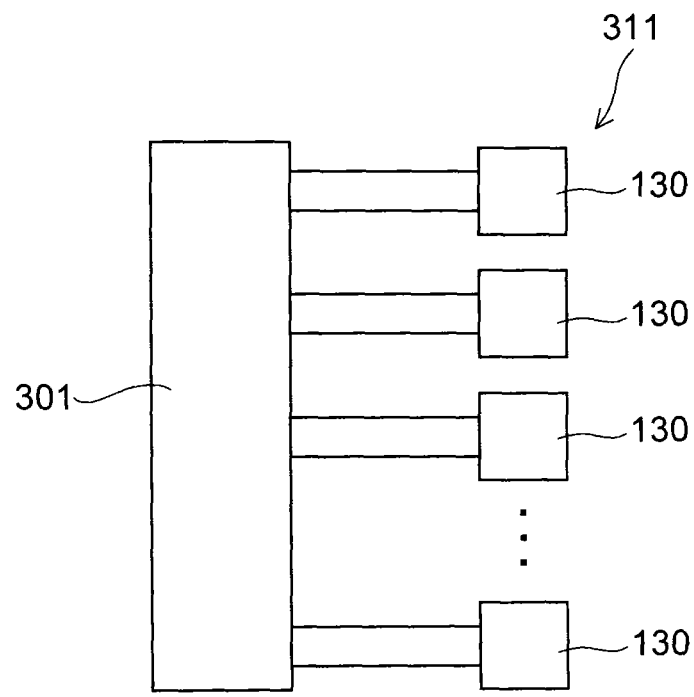
FIGS. 11A and 11B are schematic views showing illumination systems according to a third embodiment.
Figure 11B:
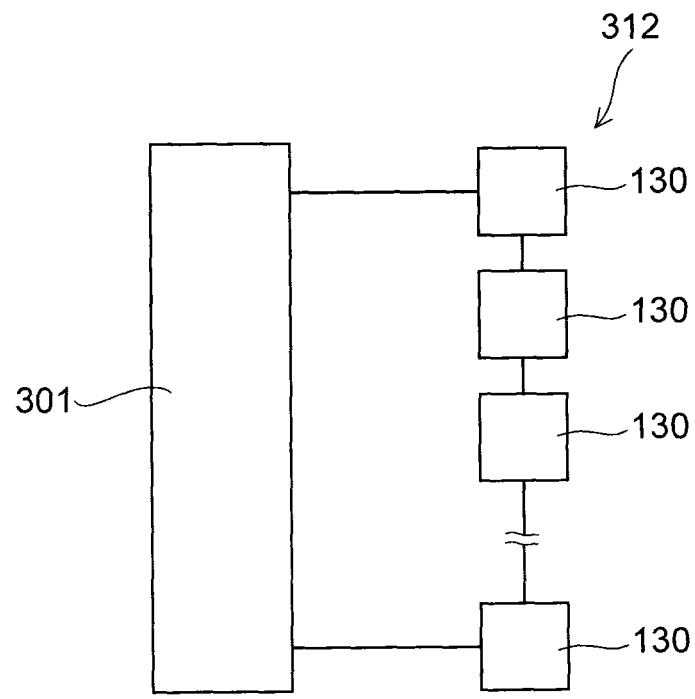

FIGS. 11A and 11B are schematic views showing illumination systems according to a third embodiment.

As shown in FIG. 11A, an illumination system 311 according to the embodiment includes a plurality of organic electroluminescent devices according to the first embodiment (for example, the organic electroluminescent device 130) and a controller 301.

The controller 301 is electrically connected to each of the plurality of organic electroluminescent devices 130, and controls turning on and off of each of the plurality of organic electroluminescent devices 130. The controller 301 is electrically connected to, for example, each of the first electrode 10 and the second electrode 20 of the plurality of organic electroluminescent devices 130. Consequently, the controller 301 controls individually the turning on and off of each of the plurality of organic electroluminescent devices 130.

As shown in FIG. 11B, in an illumination system 312, each of the plurality of organic electroluminescent devices 130 is connected in series. The controller 301 is electrically connected to the first electrode 10 of one organic electroluminescent device 130 among the plurality of organic electroluminescent devices 130. Furthermore, the controller 301 is electrically connected to the second electrode 20 of another organic electroluminescent device 130 among the plurality of organic electroluminescent devices 130. Consequently, the controller 301 controls together turning on and off of each of the plurality of organic electroluminescent devices 130. As described above, the controller 301 may control individually or together turning on and off of each of the plurality of organic electroluminescent devices 130.

An illumination system having high visibility of a transmission image can be provided by using illumination systems 311 and 312 according to the embodiment.

According to the embodiments, an organic electroluminescent device, illumination apparatus and illumination system having high visibility of a transmission image can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in organic electroluminescent devices, illumination apparatuses, and illumination systems such as first electrodes, second electrodes, organic light emitting layers, insulating layers, first substrates, second substrates, stacked bodies, first wiring layers, second wiring layers, power sources, controllers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all organic electroluminescent devices, illumination apparatuses, and illumination systems practicable by an appropriate design modification by one skilled in the art based on the organic electroluminescent devices, illumination apparatuses, and illumination systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device, comprising:
a first electrode having an upper face, the first electrode being light transmissive;
an insulating layer provided on the upper face, the insulating layer being light transmissive, the insulating layer including:
a first insulating part;
a second insulating part separated from the first insulating part in a first direction parallel to the upper face;
a third insulating part provided between the first insulating part and the second insulating part;
a fourth insulating part provided between the second insulating part and the third insulating part; and
a fifth insulating part provided between the third insulating part and the fourth insulating part, the first electrode including a first region and a second region, the first region being located between the third insulating part and the fifth insulating part when projected onto a plane parallel to the upper face, the second region being located between the fourth insulating part and the fifth insulating part when projected onto the plane;
an organic light emitting layer including a first portion and a second portion, the first portion being provided on the upper face in between the first insulating part and the third insulating part, the second portion being provided on the upper face in between the second insulating part and the fourth insulating part;
a second electrode including a first conductive part and a second conductive part, the first conductive part being provided on the first portion, the second conductive part being provided on the second portion, the second electrode being light reflective; and
a light transmissive part overlapping the first region when projected onto the plane, the light transmissive part making a phase of a first light permeating the first region to be different from a phase of a second light permeating the second region.

2. The device according to claim 1, wherein
the light transmissive part makes a phase difference between the first light and the second light be not less than 90° and not more than 270°.

3. The device according to claim 1, wherein
the organic light emitting layer has light permeability and extends on the first region; and
the light transmissive part is provided on the organic light emitting layer.

4. The device according to claim 1, further comprising a first substrate, the first substrate being light transmissive,
the first electrode being provided on the first substrate; and
the light transmissive part being provided over the first substrate.

5. The device according to claim 4, wherein
the first substrate includes a first major surface and a second major surface on a side opposite to the first major surface;
the first electrode is provided on the first major surface; and
the light transmissive part is provided on the second major surface.

6. The device according to claim 1, further comprising a first substrate and a second substrate, the first substrate and the second substrate being light transmissive,
the first electrode being provided on the first substrate;
the second substrate being provided on a stacked body including the first electrode, the insulating layer, the organic light emitting layer and the second electrode; and
the light transmissive part being provided over the second substrate.

7. The device according to claim 6, wherein
the first substrate includes a first major surface and a second major surface on a side opposite to the first major surface;
the second substrate includes a third major surface facing the first major surface and a fourth major surface on a side opposite to the third major surface;
the stacked body is provided on the first major surface; and
the light transmissive part is provided on the third major surface.

8. The device according to claim 1, wherein
the light transmissive part is provided on the first electrode and includes a same material as that in the insulating layer; and
a length of the light transmissive part in a direction perpendicular to the upper face is different from a length of the insulating layer in a direction perpendicular to the upper face.

9. The device according to claim 1, wherein
the organic light emitting layer has light permeability and extends on the first region; and
the light transmissive part is provided between the first electrode and the organic light emitting layer.

10. The device according to claim 1, further comprising a first substrate, a second substrate, and a seal part, the first substrate and second substrate being light transmissive
the first electrode being provided on the first substrate;
the second substrate being provided on a stacked body including the first electrode, the insulating layer, the organic light emitting layer, and the second electrode; and
the seal part being annularly provided along peripheries of the first substrate and the second substrate, the seal part sealing the stacked body.

11. The device according to claim 1, wherein the light transmissive part is formed by stacking a plurality of layers.

12. An organic electroluminescent device, comprising:
a first electrode having an upper face, the first electrode being light transmissive;
an insulating layer provided on the upper face, the insulating layer being light transmissive, the insulating layer including:
a first insulating part;
a second insulating part separated from the first insulating part in a first direction parallel to the upper face; and
a third insulating part provided between the first insulating part and the second insulating part, the first electrode including a first region and a second region, the first region being located between the first insulating part and the third insulating part when projected onto a plane parallel to the upper face, the second region being located between the second insulating part and the third insulating part when projected onto the plane;
a first wiring layer provided between the first electrode and the insulating layer and having an opening allowing a part of the first electrode to be exposed, the first wiring layer being light reflective;
an organic light emitting layer provided on the insulating layer, the organic light emitting layer including:
a first portion provided on the upper face in between the first insulating part and the third insulating part;
a second portion provided on the upper face in between the second insulating part and the third insulating part;
a portion provided on the first insulating part;
a portion provided on the second insulating part; and
a portion provided on the third insulating part,
the organic light emitting layer extending on the upper face in the first portion and the second portion, and extending on each of the first insulating part, the second insulating part, and the third insulating part;
a second electrode provided on the organic light emitting layer, the second electrode being light transmissive; and
a light transmissive part overlapping the first region when projected onto the plane,
a phase of a first light permeating the first region being different from a phase of a second light permeating the second region.

13. The device according to claim 12, further comprising a second wiring layer being provided on the second electrode and having an opening allowing a part of the second electrode to be exposed, the second wiring layer being light reflective.

14. The device according to claim 12, wherein the light transmissive part is provided on the second electrode.

15. The device according to claim 12, wherein the light transmissive part is provided on the first electrode and includes a same material as that in the insulating layer; and
a length of the light transmissive part in a direction perpendicular to the upper face is different from a length of the insulating layer in a direction perpendicular to the upper face.

16. An illumination apparatus, comprising:
an organic electroluminescent device, including:
- a first electrode having an upper face, the first electrode being light transmissive;
- an insulating layer provided on the upper face, the insulating layer being light transmissive, the insulating layer including:
  - a first insulating part:
  - a second insulating part separated from the first insulating part in a first direction parallel to the upper face;
  - a third insulating part provided between the first insulating part and the second insulating part;
  - a fourth insulating part provided between the second insulating part and the third insulating part; and
  - a fifth insulating part provided between the third insulating part and the fourth insulating part, the first electrode including a first region and a second region, the first region being located between the third insulating part and the fifth insulating part when projected onto a plane parallel to the upper face, the second region being located between the fourth insulating part and the fifth insulating part when projected onto the plane;
- an organic light emitting layer including a first portion and a second portion, the first portion being provided on the upper face in between the first insulating part and the third insulating part, the second portion being provided on the upper face in between the second insulating part and the fourth insulating part;
- a second electrode including a first conductive part provided on the first portion and a second conductive part provided on the second portion, the second electrode being light reflective; and
- a light transmissive part overlapping the first region when projected onto the plane, the light transmissive part making a phase of a first light permeating the first region to be different from a phase of a second light permeating the second region; and
a power source being electrically connected to the first electrode and the second electrode and supplying a current to the organic light emitting layer via the first electrode and the second electrode.

17. An illumination system, comprising:
a plurality of organic electroluminescent devices, each of the organic electroluminescent devices including:
- a first electrode having an upper face, the first electrode being light transmissive;
- an insulating layer provided on the upper face, the insulating layer being light transmissive, the insulating layer including:
  - a first insulating part;
  - a second insulating part separated from the first insulating part in a first direction parallel to the upper face;
  - a third insulating part provided between the first insulating part and the second insulating part;
  - a fourth insulating part provided between the second insulating part and the third insulating part; and
  - a fifth insulating part provided between the third insulating part and the fourth insulating part, the first electrode including a first region and a second region, the first region being located between the third insulating part and the fifth insulating part when projected onto a plane parallel to the upper face, the second region being located between the fourth insulating part and the fifth insulating part when projected onto the plane;
- an organic light emitting layer including a first portion and a second portion, the first portion being provided on the upper face in between the first insulating part and the third insulating part, the second portion being provided on the upper face in between the second insulating part and the fourth insulating part;
- a second electrode including a first conductive part provided on the first portion and a second conductive part provided on the second portion, the second electrode being light reflective; and
- a light transmissive part overlapping the first region when projected onto the plane, the light transmissive part making a phase of a first light permeating the first region to be different from a phase of a second light permeating the second region; and
a controller being electrically connected to each of the organic electroluminescent devices and controlling turning on and off of each of the organic electroluminescent devices.

18. An illumination system, comprising:
a plurality of organic electroluminescent devices, each of the organic electroluminescent devices including:
- a first electrode having an upper face, the first electrode being light transmissive;
- an insulating layer provided on the upper face, the insulating layer being light transmissive, the insulating layer including:
  - a first insulating part;
  - a second insulating part separated from the first insulating part in a first direction parallel to the upper face; and
  - a third insulating part provided between the first insulating part and the second insulating part, the first electrode including a first region and a second region, the first region being located between the first insulating part and the third insulating part when projected onto a plane parallel to the upper face, the second region being located between the second insulating part and the third insulating part when projected onto the plane;
- an organic light emitting layer provided on the insulating layer, the organic light emitting layer including:
  - a first portion provided on the upper face in between the first insulating part and the third insulating part;
  - a second portion provided on the upper face in between the second insulating part and the third insulating part;
  - a portion provided on the first insulating part;
  - a portion provided on the second insulating part; and
  - a portion provided on the third insulating part,
  the organic light emitting layer extending on the upper face in the first portion and the second portion, and extending on each of the first insulating part, the second insulating part, and the third insulating part;
- a second electrode provided on the organic light emitting layer, the second electrode being light transmissive; and
- a light transmissive part overlapping the first region when projected onto the plane; and
a controller being electrically connected to each of the organic electroluminescent devices and controlling turning on and off of each of the organic electroluminescent devices, a phase of a first light permeating the first region being different from a phase of a second light permeating the second region.

19. An organic electroluminescent device, comprising:
a first electrode having an upper face, the first electrode being light transmissive;
an insulating layer provided on the upper face, the insulating layer being light transmissive, the insulating layer including:
a first insulating part;
a second insulating part separated from the first insulating part in a first direction parallel to the upper face; and
a third insulating part provided between the first insulating part and the second insulating part, the first electrode including a first region and a second region, the first region being located between the first insulating part and the third insulating part when projected onto a plane parallel to the upper face, the second region being located between the second insulating part and the third insulating part when projected onto the plane;
an organic light emitting layer provided on the insulating layer, the organic light emitting layer including:
a first portion provided on the upper face in between the first insulating part and the third insulating part;
a second portion provided on the upper face in between the second insulating part and the third insulating part;
a portion provided on the first insulating part;
a portion provided on the second insulating part; and
a portion provided on the third insulating part,
the organic light emitting layer extending on the upper face in the first portion and the second portion, and extending on each of the first insulating part, the second insulating part, and the third insulating part;
a second electrode provided on the organic light emitting layer, the second electrode being light transmissive;
a second wiring layer provided on the second electrode and having an opening allowing a part of the second electrode to be exposed, the second wiring layer being light reflective; and
a light transmissive part overlapping the first region when projected onto the plane,
a phase of a first light permeating the first region being different from a phase of a second light permeating the second region.

\* \* \* \* \*